(12) United States Patent
Ishikawa

(10) Patent No.: US 7,537,822 B2
(45) Date of Patent: May 26, 2009

(54) HARD-COATED MEMBER

(75) Inventor: Takeshi Ishikawa, Chiba-ken (JP)

(73) Assignee: Hitachi Tool Engineering, Ltd., Chiba-ken (JP)

( * ) Notice: Subject to any disclaimer, the term of this patent is extended or adjusted under 35 U.S.C. 154(b) by 166 days.

(21) Appl. No.: 11/382,366

(22) Filed: May 9, 2006

(65) Prior Publication Data

US 2006/0269788 A1    Nov. 30, 2006

(30) Foreign Application Priority Data

| May 26, 2005 | (JP) | ............................. 2005-153630 |
| Nov. 16, 2005 | (JP) | ............................. 2005-331192 |
| Nov. 16, 2005 | (JP) | ............................. 2005-331193 |

(51) Int. Cl.
   *B32B 9/00*    (2006.01)

(52) U.S. Cl. ....................... 428/212; 428/697; 428/698; 428/699; 428/701; 428/702

(58) Field of Classification Search .................. 428/212, 428/697, 698, 699, 701, 702
See application file for complete search history.

(56) References Cited

U.S. PATENT DOCUMENTS

| 4,984,940 A |  | 1/1991 | Bryant et al. |
| 5,700,551 A | * | 12/1997 | Kukino et al. ................ 428/698 |
| 6,586,122 B2 | * | 7/2003 | Ishikawa et al. ............. 428/698 |
| 6,824,601 B2 | * | 11/2004 | Yamamoto et al. .......... 428/699 |
| 7,060,345 B2 | * | 6/2006 | Fukui et al. .................. 428/216 |

2006/0222893 A1    10/2006    Derflinger

FOREIGN PATENT DOCUMENTS

| EP | 0 701 982 A1 A | 3/1996 |
| EP | 1 219 723 A2 | 7/2002 |
| EP | 1 382 709 A1 | 1/2004 |
| EP | 1422311 | * 5/2004 |

(Continued)

OTHER PUBLICATIONS

Wadsworth I et al: "Thermal Stability and Oxidationi Resistance of TiAlN/CrN Multilayer Coatings" Surface and Coatings Technology, Elsevier, Amsterdam, NL, vol. 94/95, No. 1/3, Oct. 1997, pp. 315-321, XP000978315 ISSN: 0257-8972.

*Primary Examiner*—Archene Turner
(74) *Attorney, Agent, or Firm*—Sughrue Mion, PLLC

(57) ABSTRACT

A hard-coated member comprising a hard coating comprising a lowermost layer, an intermediate laminate and an uppermost layer on a substrate, the intermediate laminate being constituted by alternately laminated layers A and layers B having different compositions, the layers A and the layers B being respectively made of at least one selected from the group consisting of nitrides, borides, carbides and oxides of metal components having compositions represented by the formula of $Al_WCr_XTi_YSi_Z$, wherein W, X, Y and Z respectively represent atomic % of Al, Cr, Ti and Si, $W+X+Y+Z=100$, and these combinations, the layers A meeting the condition of $70 \leq W+X<100$, the layers B meeting the condition of $30 \leq Y<100$, and the uppermost layer being made of at least one selected from the group consisting of nitrides, carbides, sulfides and borides of Ti or Ti and Si and these combinations, or at least one selected from the group consisting of nitrides, carbides, sulfides and borides of Cr or Cr and Si and these combinations.

9 Claims, 5 Drawing Sheets

FOREIGN PATENT DOCUMENTS

| | | |
|---|---|---|
| JP | 02-243756 | 9/1990 |
| JP | 07-205361 | 8/1995 |
| JP | 2001-254187 | 9/2001 |
| JP | 2003-071610 | 3/2003 |
| JP | 2004-238736 | 8/2004 |
| WO | WO 2006/102780 A1 | 10/2006 |

\* cited by examiner

HARD-COATED MEMBER

FIELD OF THE INVENTION

The present invention relates to a hard-coated member having not only excellent lubrication and resistance to peeling from a substrate, but also excellent seizure resistance and/or wear resistance, which is suitable as members requiring high hardness, such as cutting tools, molding dies, bearings, forming dies, rolls, etc.

BACKGROUND OF THE INVENTION

Cutting tools, etc. are provided with single- or multi-layer hard coatings made of carbides, nitrides and carbonitrides of Al, Cr, Ti and Si, or oxides of Al, etc., to improve hardness, wear resistance, lubrication, seizure resistance, etc. Particularly because coatings of composite nitrides of Ti and Al (TiAlN) exhibit excellent wear resistance, they are formed on cutting tools of high-hardness materials such as high-speed steel, hardened steel, etc.

JP 2003-71610A discloses a cutting tool having a multi-layer coating, as a hard coating having higher wear resistance than TiAlN, which is formed by alternately laminating two types of layers having different compositions plurality times, both within a composition range represented by $(Ti_aAl_bCr_c)$ $(C_{1-d}N_d)$, wherein a, b and c represent the atomic ratios of Ti, Al and Cr, respectively, and d represents the atomic ratio of N, meeting $0.02 \leq a \leq 0.30$, $0.55 \leq b \leq 0.765$, $0.06 \leq c, a+b+c=1$, and $0.5 \leq d \leq 1$, or $0.02 \leq a \leq 0.175$, $0.765 \leq b$, $4(b-0.75) \leq c$, $a+b+c=1$, and $0.5 \leq d \leq 1$. Although this multi-layer coating has excellent wear resistance, it fails to sufficiently meet an increasingly mounting demand to provide cutting tools with higher wear resistance and/or seizure resistance.

JP 2004-238736A discloses a hard coating formed by an arc-discharge ion plating method, which has a composition comprising a metal component represented by $Al_xCr_{1-x}$ wherein x represents an atomic ratio meeting $0.45 \leq x \leq 0.75$, and a non-metal component represented by $N_{1-\alpha-\beta-\gamma}B_\alpha C_\beta O_\gamma$, wherein $\alpha$, $\beta$ and $\gamma$ respectively represent atomic ratios meeting $0 \leq \alpha \leq 0.15$, $0 \leq \beta \leq 0.35$, and $0.01 \leq \gamma \leq 0.25$, the hard coating having the maximum X-ray diffraction intensity in a (200) plane or a (111) plane, and the bonding energy of Al and/or Cr and oxygen in a range of 525-535 eV in X-ray electron spectroscopy. It further describes that a hard coating formed by laminating two layers having different compositions within the above ranges has not only improved hardness and wear resistance, but also improved adhesion to a substrate. However, it still fails to sufficiently meet an increasingly mounting demand to provide cutting tools with higher wear resistance and/or seizure resistance.

JP 7-205361A discloses a member having a hard coating formed by laminating at least one compound selected from the group consisting of nitrides, oxides, carbides, carbonitrides and borides of metal elements of Groups IVa, Va and VIa, Al and Si, and a nitride, an oxide, a carbide, a carbonitride and/or a boride of two types of metal elements selected from the group consisting of metal elements of Groups IVa, Va and VIa, Al and Si, at a period of 0.4-50 nm to a total thickness of 0.5-10 µm. Although this hard coating has excellent wear resistance, it still fails to sufficiently meet an increasingly mounting demand to provide cutting tools with higher wear resistance and/or seizure resistance.

OBJECT OF THE INVENTION

Accordingly, an object of the present invention is to provide a hard-coated member having not only excellent lubrication and resistance to peeling from a substrate, but also excellent seizure resistance and/or wear resistance.

DISCLOSURE OF THE INVENTION

As a result of intensive research in view of the above object, it has been found that by forming an upper layer made of at least one of nitrides, carbides, sulfides and borides of Ti or Ti and Si, or at least one of nitrides, carbides, sulfides and borides of Cr or Cr and Si on a laminate having two types of layers having different compositions, it is possible to obtain a hard coating having not only excellent lubrication and resistance to peeling from a substrate, but also excellent seizure resistance and/or wear resistance. The present invention has been completed based on such finding.

Thus, the first hard-coated member of the present invention comprises a hard coating comprising a lowermost layer, an intermediate laminate and an uppermost layer on a substrate, the intermediate laminate being constituted by alternately laminated layers A and layers B having different compositions, the layers A and the layers B being respectively made of at least one selected from the group consisting of nitrides, borides, carbides and oxides of metal components having compositions represented by the formula of $Al_WCr_XTi_YSi_Z$, wherein W, X, Y and Z respectively represent atomic % of Al, Cr, Ti and Si, $W+X+Y+Z=100$, and these combinations, the layers A meeting the condition of $70 \leq W+X<100$, the layers B meeting the condition of $30 \leq Y<100$, and the uppermost layer being made of at least one selected from the group consisting of nitrides, carbides, sulfides and borides of Ti or Ti and Si and these combinations.

The second hard-coated member of the present invention comprises a hard coating comprising a lowermost layer, an intermediate laminate and an uppermost layer on a substrate, the intermediate laminate being constituted by alternately laminated layers A and layers B having different compositions, the layers A and the layers B being respectively made of at least one selected from the group consisting of nitrides, borides, carbides and oxides of metal components having compositions represented by the formula of $Al_WCr_XTi_YSi_Z$, wherein W, X, Y and Z respectively represent atomic % of Al, Cr, Ti and Si, $W+X+Y+Z=100$, and these combinations, the layers A meeting the condition of $70 \leq W+X<100$, the layers B meeting the condition of $30 \leq Y<100$, and the uppermost layer being made of at least one selected from the group consisting of nitrides, carbides, sulfides and borides of Cr or Cr and Si and these combinations.

In the first hard-coated member, the uppermost layer is preferably based on a carbonitride, a sulfide or a boride containing 50 atomic % or more of Ti.

In the second hard-coated member, the uppermost layer is preferably based on a carbonitride, a sulfide or a boride containing 50 atomic % or more of Cr.

The layers A and the layers B in the intermediate laminate are preferably as thick as 0.5-100 nm.

The intermediate laminate preferably has at least two peaks in X-ray diffraction in a 2θ range of 40° to 45°.

In the layers A and the layers B constituting the intermediate laminate, at least Al, Cr and Ti are mutually diffused.

The intermediate laminate has an Si content gradient higher toward the upper surface.

The lowermost layer is preferably made of a nitride comprising at least one metal element selected from the group consisting of Al, Cr, Ti and Si.

There is preferably mutual diffusion in interfaces between the lowermost layer and the intermediate laminate, between the layer A and the layer B in the intermediate laminate, and between the uppermost layer and the intermediate laminate.

DESCRIPTION OF THE PREFERRED EMBODIMENTS

[1] Layer Structure of Hard Coating

Figure 1:
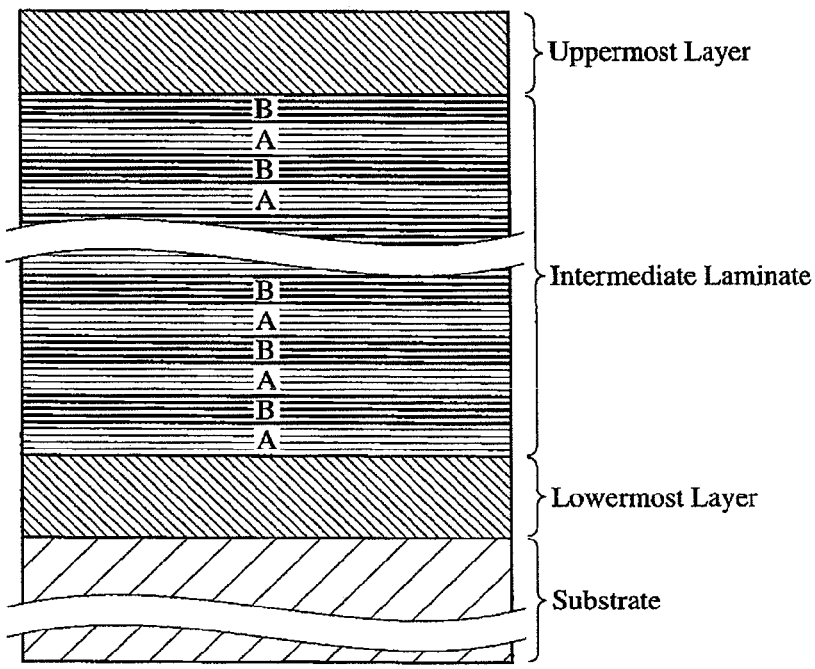
FIG. 1 is a schematic cross-sectional view showing the layer structure of a hard coating in the hard-coated member of the present invention.

As shown in FIG. 1, the hard-coated member of the present invention has a structure comprising a hard coating comprising a lowermost layer, an intermediate laminate and an uppermost layer on a substrate. The intermediate laminate has a structure comprising alternately laminated layers A and layers B having different compositions. It is preferable that these layers are continuously laminated on a substrate surface by a physical vapor deposition method.

The uppermost layer functions to improve not only hardness, heat resistance, lubrication, etc., but also seizure resistance and/or wear resistance. The lowermost layer absorbs the residual stress of the intermediate laminate and the uppermost layer, prevents peeling and abnormal wear, and improves wear resistance. The intermediate laminate assists the uppermost layer to exhibit its properties sufficiently.

(1) Composition of Uppermost Layer

The uppermost layer has a different composition from that of the intermediate laminate. The first hard-coated member has an uppermost layer based on a carbonitride, a sulfide or a boride containing 50 atomic % or more of Ti (hereinafter referred to simply as "first uppermost layer"), and the second hard-coated member has an uppermost layer based on a carbonitride, a sulfide or a boride containing 50 atomic % or more of Cr (hereinafter referred to simply as "second uppermost layer").

Any uppermost layer is preferably as thick as 50 nm or more to obtain the above effect. The uppermost layer preferably contains oxygen such that the concentration of oxygen is highest in a depth range within 100 nm. The inclusion of oxygen is particularly effective to prevent the seizure of a work material to a hard coating surface. Incidentally, another layer may be formed on the uppermost layer. For instance, because the uppermost layer of the present invention is so grayish that it is difficult to discern by the naked eye whether or not the coating is formed, a dark-color layer such as a carbon layer, etc. may be formed on the uppermost layer to identify the presence of the hard coating.

(a) Composition of First Uppermost Layer

The first uppermost layer is made of at least one selected from the group consisting of nitrides, carbides, sulfides and borides of Ti or Ti and Si and these combinations, and may contain several % of other inevitably introduced elements. The first uppermost layer is preferably a layer based on a carbonitride, a sulfide or a boride containing 50 atomic % or more of Ti. In an interface between the first uppermost layer and the intermediate laminate, their compositions are preferably mutually diffused to improve adhesion strength. The first uppermost layer provides the coating with improved hardness. It further extremely suppresses peeling and abnormal wear, and improves the lubrication of the entire hard coating, resulting in extreme improvement in chip dischargeability. The first uppermost layer is particularly suitable as coating layers for drills.

(b) Composition of Second Uppermost Layer

The second uppermost layer is made of at least one selected from the group consisting of nitrides, carbides, sulfides and borides of Cr or Cr and Si, and these combinations, and may contain several % of other inevitably introduced elements. The second uppermost layer is preferably a layer based on a carbonitride, a sulfide or a boride containing 50 atomic % or more of Cr. In an interface between the second uppermost layer and the intermediate laminate, their compositions are preferably mutually diffused to improve adhesion strength. The second uppermost layer improves lubrication and seizure resistance while maintaining good heat resistance and wear resistance. It further extremely suppresses peeling and abnormal wear, and improves the lubrication of the entire hard coating, resulting in extreme improvement in chip dischargeability. The second uppermost layer is particularly suitable as coating layers for drills and end mills.

(2) Composition of Intermediate Laminate

The intermediate laminate has a structure comprising alternately laminated layers A and layers B having different compositions, and any of the layers A and the layers B is made of at least one selected from the group consisting of nitrides, borides, carbides and oxides of metal components having compositions represented by the formula of $Al_W Cr_X Ti_Y Si_Z$, wherein W, X, Y and Z respectively represent atomic % of Al, Cr, Ti and Si, W+X+Y+Z=100, and these combinations.

The metal component of the layer A has a composition of $Al_W Cr_X Ti_Y Si_Z$, wherein W+X+Y+Z=100, and $70 \leq W+X<100$ (atomic %). When the value of (W+X) is less than 70, the layers A are insufficient not only in a heat resistance-improving effect, but also in hardening by combination of the layers B. Incidentally, even the slightest amount of Si contributes to improvement in the hardness of the layers A. On the premise of meeting the condition of $70 \leq W+X<100$, W meets preferably $30 \leq W \leq 70$, more preferably $35 \leq W \leq 70$, particularly $45 \leq W \leq 65$. Also, X meets preferably $20 \leq X \leq 60$, more preferably $25 \leq X \leq 50$, particularly $25 \leq X \leq 35$. Y and Z meet preferably $0 < Y \leq 30$ and $Z \leq 10$, more preferably $2 \leq Y \leq 10$ and $Z \leq 5$.

The metal component in the layers B has a composition represented by $Al_W Cr_X Ti_Y Si_Z$, wherein W+X+Y+Z=100, and $30 \leq Y \leq 100$ (atomic %). When the value of Y is less than 30, the layers A have low adhesion strength to the layers B, resulting in the intermediate laminate with insufficient hardness. This is due to the fact that the crystal structure of the intermediate laminate has an hcp structure. Incidentally, even the slightest amount of Si contributes to improvement in the hardness of the layers B. Y meets preferably $30 \leq Y \leq 95$, more preferably $30 \leq Y \leq 90$. W, X and Z meet preferably $0 < W \leq 50$, $0 < X \leq 20$, and $Z \leq 20$, more preferably $1 \leq W \leq 50$, $1 \leq X \leq 15$, and $Z \leq 10$.

The thickness of each layer A, B is preferably 0.5-100 nm, more preferably 1-70 nm, particularly 2-50 nm. With such thickness, the intermediate laminate containing Al, Cr and Ti as indispensable components is provided with high hardness, resulting in improvement in its adhesion strength to the lowermost layer and the uppermost layer, and the strength balance of the entire hard coating. When each layer A, B has a thickness of less than 0.5 nm, it has low hardness and lubrication. On the other hand, when each layer A, B has a thickness of more than 100 nm, the intermediate laminate does not have sufficiently high hardness. Incidentally, even if the intermediate laminate has other layers as thick as 100 nm or more in addition to the layers A and the layers B, the intermediate laminate can exhibit the above properties.

The intermediate laminate preferably has at least two peaks in X-ray diffraction in a 2θ range of 40° to 45°. This means that 2 or more other phases having different lattice constants are formed in the intermediate laminate, thereby inducing strain in the intermediate laminate, and thus contributing to increasing the hardness.

The layers A and the layers B constituting the intermediate laminate are preferably layers in which at least Al, Cr and Ti are mutually diffused. The mutual diffusion improves adhesion strength in interfaces between the lowermost layer and the intermediate laminate, between the layers A and the layers B in the intermediate laminate, and between the intermediate laminate and the uppermost layer, resulting in providing the intermediate laminate with improved hardness, and providing the entire hard coating with optimized strength balance. The presence of mutually diffused layers can be confirmed by lattice image observation by a transmission electron microscope, and the energy-dispersive X-ray spectroscopy (EDS) analysis of each layer.

A crystal lattice is preferably continuous between the layers A and the layers B, to improve the adhesion strength of the layers A to the layers B and their wear resistance. The continuous crystal lattice structure can be confirmed by lattice image observation by a transmission electron microscope, a selected-area diffraction image, or a micro-area electron beam diffraction.

Figure 1A:
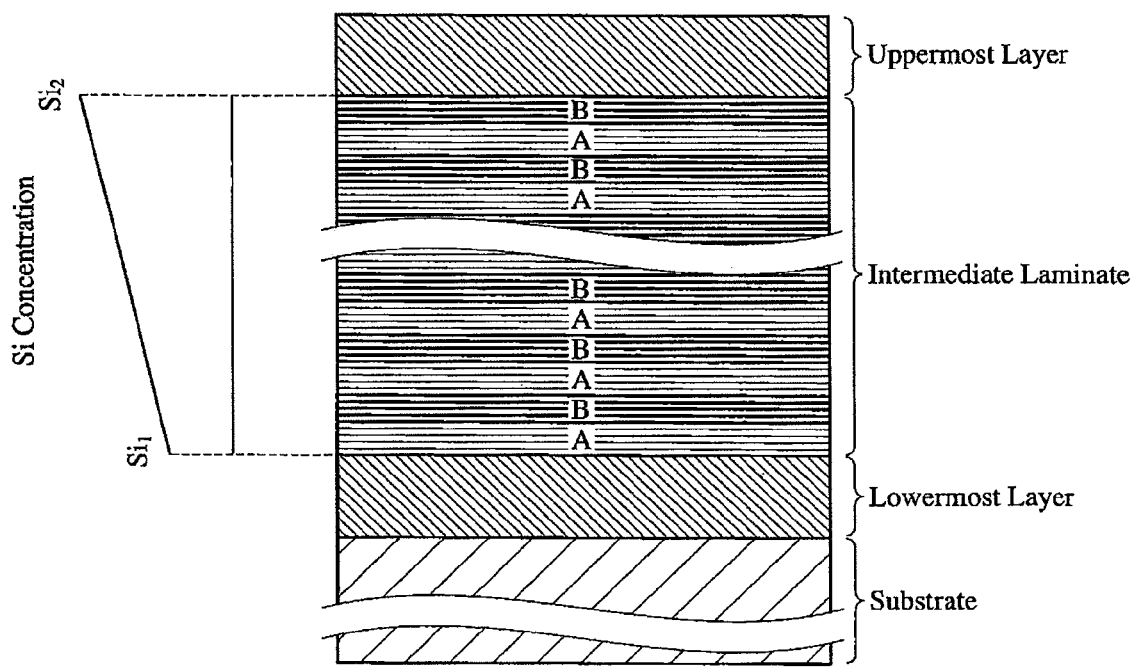
FIG. 1A is a schematic cross-sectional view showing the Si content gradient in the intermediate laminate of a hard coating in the hard coating member of the present invention.

The Si content in the intermediate laminate preferably increases as the layer nears the surface. Specifically, the Si content gradient is depicted in FIG. 1A. As is clear from FIG. 1A, the Si content increases from $Si_1$ at the bottom of the intermediate laminate to $Si_2$ at the top of the intermediate laminate. This Si content gradient is later described in Paragraph [0100] in the present specification, in relevant part as follows: "The cutting tool of Experiment 13 with an Si content gradient higher toward the upper surface in an intermediate laminate had a longer cutting life and thus better wear resistance than those of the cutting tool of Experiment 4, which had the same average composition without gradient.

This provides the intermediate laminate with adhesion strength, hardness and strength changing in a thickness direction, thereby improving the wear resistance of the entire hard coating.

(3) Composition of Lowermost Layer

The lowermost layer is preferably made of at least one metal element selected from the group consisting of nitrides of Al, Cr, Ti and Si. The lowermost layer preferably contains 50 atomic % or more of Al. The lowermost layer having such composition relaxes the stress of the intermediate laminate and the uppermost layer. There is preferably mutual diffusion in an interface between the lowermost layer and the intermediate laminate. The mutual diffusion improves the adhesion strength. It may contain a trace amount of oxygen, carbon, boron or sulfur as a non-metal component other than nitrogen.

The compositions of the uppermost layer, the intermediate laminate and the lowermost layer can be analyzed by an electron probe microanalyzer (EPMA), an energy-dispersive X-ray spectroscope (EDX), EDS attached to a transmission electron microscope, or an electron energy loss spectroscope (EELS). For the composition analysis of each layer, analyses such as a Rutherford backscattering spectrometory (RBS), an electron spectroscopy (XPS), AES, etc. may also be used.

(4) Thickness and Properties of Each Layer (a) Thickness of Each Layer

The thickness $T_U$ of the uppermost layer is preferably 0.01-5 μm. When the uppermost layer is less than 0.01 μm, it provides insufficient effects of improving seizure resistance and/or wear resistance. On the other hand, when the uppermost layer is more than 5 μm, a sufficient wear resistance-improving effect cannot be obtained. The thickness $T_M$ of the intermediate laminate is preferably 0.1-5 μm. When the intermediate laminate is less than 0.1 μm, well-balanced adhesion strength, hardness and strength are not achieved between the uppermost layer and the lowermost layer, failing to sufficiently improve the wear resistance. The thickness $T_L$ of the lowermost layer is preferably 0.01-3 μm. When the lowermost layer is less than 0.01 μm, it falls to cause the high hardness of the uppermost layer to sufficiently improve the wear resistance. On the other hand, when the thickness of the lowermost layer is more than 3 μm, the hard coating is likely to peel off or be abnormally worn. Particularly when the relation of $T_M \geq T_U \geq T_L$ is met, the effect of the present invention can be exhibited at maximum.

(b) Properties

The hardness H of the intermediate laminate is preferably 30-50 GPa, more preferably 30-40 GPa. The modulus E of the intermediate laminate is preferably 450-550 GPa. The modulus recovery ratio R of the intermediate laminate is preferably 28-38%, more preferably 28-34%. When the value of R is less than 28%, the hard coating has insufficient wear resistance. On the other hand, when the value of R is more than 38%, the hard coating has poor peel resistance and is likely to be abnormally worn. With the hardness H, the modulus E or the modulus recovery ratio R within the above range, the entire hard coating has optimally balanced adhesion strength, lubrication and heat resistance, exhibiting the maximum effects of the lowermost layer and the uppermost layer, thereby being effective to prevent abnormal wear.

The hardness H, the modulus E, and the modulus recovery ratio R are determined from contact depth measured by a hardness-measuring method by nano-indentation and the maximum displacement at the maximum load (W C. Oliver and G. M. Pharr: J. Mater. Res., Vol. 7, No.6, June, 1992, pp. 1564-1583). The modulus recovery ratio R is defined as R=100−[(contact depth)/(maximum displacement at maximum load)]. The hardness H is different from usual plastic deformation hardness such as Vickers hardness, etc.

[2] Coating Method

The lowermost layer, the intermediate laminate and the uppermost layer are preferably formed on a substrate by a physical vapor deposition method. Particularly preferable as the physical vapor deposition method are a sputtering method and an arc-discharge ion plating (AIP) method. Using these methods, the hard coating having excellent hardness, adhesion strength, peel resistance and abnormal wear resistance can be formed.

In the above coating method, the lowermost layer, the intermediate laminate and the uppermost layer are preferably formed successively, using a lowermost-layer-forming metal target 1 and an uppermost-layer-forming metal target 2. Specifically, the metal target 1 is first discharged to form the lowermost layer, and the metal target 1 and the metal target 2 are then discharged simultaneously to form the intermediate laminate. Finally, the discharge of the metal target 1 is stopped, and the uppermost layer is formed by the metal target 2. By this coating method, the hard-coated member having excellent seizure resistance and/or wear resistance can be obtained.

The hard-coated member of the present invention is preferably an end mill or a drill having a hard coating formed on a substrate of high-speed steel, cemented carbide, cermet, etc. The hard coating remarkably improves the wear resistance, resulting in a tool with extremely reduced wear. Because the hard coating particularly improves the lubrication, the hard-coated member is suitable as a drill.

The present invention will be explained in more detail referring to Examples below without intention of restricting the scope of the present invention.

EXAMPLE 1

(1) AIP Apparatus

Figure 2:
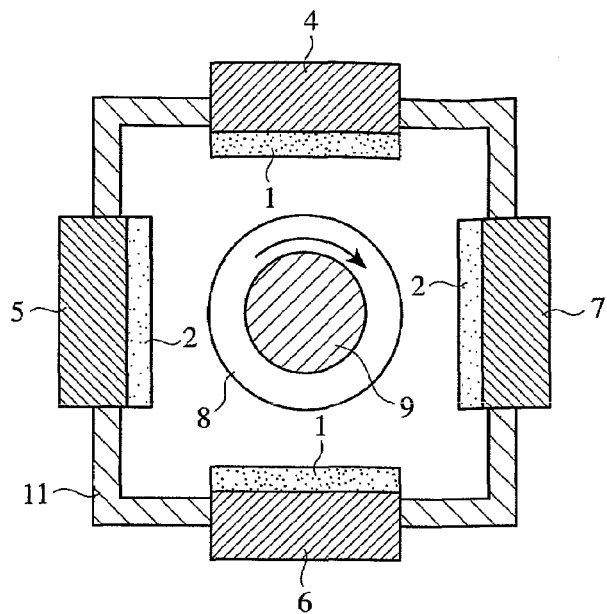
FIG. 2 is a schematic view showing one example of an apparatus for forming the hard coating.

The formation of a hard coating was conducted using an AIP apparatus shown in FIG. 2. The AIP apparatus comprises a vacuum chamber 11, pluralities of arc-discharge evaporators 4-7 disposed on an inner wall of the vacuum chamber 11, and a substrate holder 8 disposed on a bottom of the vacuum chamber 11. The arc-discharge evaporators 4-7 are insulated from the wall of the vacuum chamber 11. Each arc-discharge evaporator 4, 6 is provided with a target 1 for forming a metal component of the lowermost layer in the hard coating, and each arc-discharge evaporator 5, 7 is provided with a target 2 for forming a metal component of the uppermost layer in the hard coating. Arc discharge is generated on the targets 1 and/or 2 by supplying predetermined current to each arc-discharge evaporator 4-7, to evaporate and ionize the metal component, and metals were vapor-deposited from the targets 1 and/or 2 onto a substrate 9 placed on the substrate holder 8 by applying a bias voltage between the vacuum chamber 11 and the substrate holder 8. The substrate 9 can be rotated at 1-10 rpm by a rotation mechanism (not shown) mounted to the substrate holder 8. When the substrate 9 faces the target 1, a layer containing the metal component of the target 1 is formed, and when the substrate 9 faces the target 2, a layer containing the metal component of the target 2 is formed.

The addition of carbon, oxygen, nitrogen or boron to the hard coating was conducted by introducing a gas composition comprising one or more of a $CH_4$ gas, a $C_2H_2$ gas, an $O_2$ gas, a CO gas, an $N_2$ gas, an Ar gas, etc. into the vacuum chamber 11 during a coating step, such that the desired coating composition was obtained. For instance, a nitride having a metal composition of the target can be formed by conducting the coating step while introducing a nitrogen gas.

(2) Pretreatment of Substrate

Using a cemented carbide comprising 13.5% by mass of Co, the balance being WC and inevitable impurities, as a substrate, an insert of JIS SNGA432 was produced. After degreasing and washing, the substrate was mounted to the substrate holder 8, and heated at 550° C. for 30 minutes by a heater disposed in the vacuum chamber 11 to carry out a degassing treatment. An Ar gas introduced into the vacuum chamber 11 was then ionized by a heating filament disposed in the vacuum chamber 11, and bias voltage was applied to the substrate to clean the substrate surface by Ar ions for 30 minutes.

(3) Production of Sample 1

Metal targets 1, 2 produced by a powder metallurgy method were used to form the hard coating of Sample 1. As shown in FIG. 2, lowermost-layer-forming targets 1, 1 having a composition of $Al_{60}Cr_{37}Si_3$ (atomic %) were attached to the arc-discharge evaporators 4 and 6, and uppermost-layer-forming targets 2, 2 having a composition of $Ti_{100}$ were attached to the arc-discharge evaporators 5 and 7.

(a) Formation of Lowermost Layer

With current of 25 V, 100 A supplied to the evaporators 4 and 6 each having the target 1, a lowermost nitride layer of about 200 nm was formed on the substrate surface under the conditions of a negative-bias voltage of 50 V, a nitrogen-based reaction gas pressure of 4 Pa, a substrate temperature of 500° C., and a substrate-rotating speed of 3 rpm. Although the target composition was $Al_{60}Cr_{37}Si_3$, the vapor-deposited layer had a metal composition of $Al_{57}Cr_{41}Si_2$.

(b) Formation of Intermediate Laminate

As the coating time passed, current (25 V) supplied to the evaporators 4 and 6 each having the target 1 was changed stepwise from 100 A to 60 A, while current (20 V) supplied to the evaporators 5 and 7 each having the target 2 was changed stepwise from 60 A to 100 A. Applied to the substrate was a pulse bias voltage (negative-bias voltage: 60 V, positive bias voltage: 10 V, frequency: 20 kHz, and amplitude; 80% on the negative side and 20% the positive side). The nitrogen-based reaction gas pressure was 6 Pa, the substrate temperature was 525° C., and the rotation speed of the substrate was 6 rpm. Thus, an intermediate nitride laminate of about 2600 nm was formed on the lowermost layer.

(c) Formation of Uppermost Layer

The supply of current to the evaporators 4 and 6 each having the target 1 was stopped, and an uppermost carbonitride layer of about 200 nm was formed by the target 2, under the conditions of a negative-bias voltage of 100 V, a positive bias voltage of 0 V, a frequency of 10 kHz, an amplitude of 95% on the negative side and 5% on the positive side, a reaction gas pressure of 1.5 Pa ($N_2$: 100 sccm, Ar: 30 sccm, $C_2H_2$: 20 sccm), a substrate temperature of 500° C., and a substrate-rotating speed of 3 rpm (Sample 1).

(4) Structural Analysis of Sample 1

Figure 3:
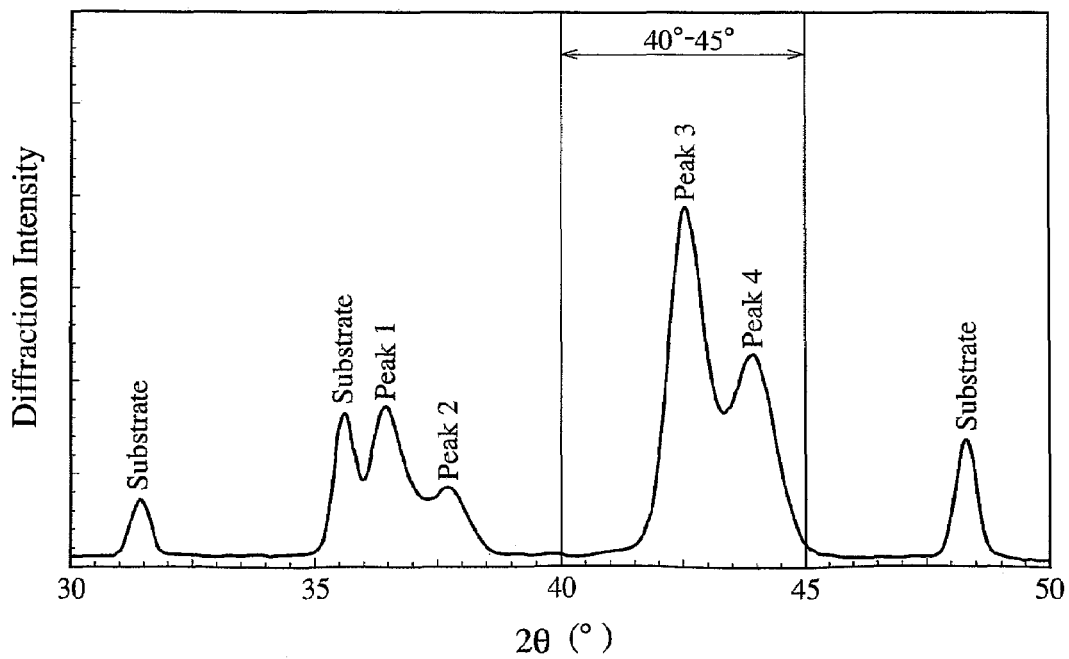
FIG. 3 is a graph showing an X-ray diffraction pattern of the intermediate laminate of Sample 1.

The thickness, laminate structure, composition and crystal structure of the intermediate laminate in the hard coating of Sample 1 were measured by the following methods. The qualitative analysis of the crystal structure by X-ray diffraction was conducted on a hard coating composed only of an intermediate laminate to remove the influence of the lowermost layer and the uppermost layer. Using an X-ray diffraction apparatus (Rotaflex RV-200B, available from Rigaku Corporation) with CuKα rays as an X-ray source, the X-ray diffraction measurement was conducted at a tube voltage of 120 kV and current of 40 μA, an incident angle of 5°, an incident slit of 0.4 mm, and 2θ of 30°-70°. An X-ray diffraction chart is shown in FIG. 3. FIG. 3 indicates that the intermediate laminate of Sample 1 had an Fcc structure with at least two peaks in X-ray diffraction in a 2θ range of 40° to 45°. In FIG. 3, a peak 1 is a diffraction peak of (111) planes of the fcc structure of the layers B, a peak 2 is a diffraction peak of (111) planes of the layers A, a peak 3 is a diffraction peak of (200) planes of the layers B, and a peak 4 is a diffraction peak of (200) planes of the layers A. Diffraction peaks of the substrate are indicated as "substrate."

The analysis of the layer structure of the hard coating was conducted by a transmission electron microscope (TEM). A sample used in TEM observation was produced by bonding Sample 1 to a dummy substrate with an epoxy resin, cutting it, bonding a reinforcing ring to it, grinding and dimpling it, and milling it with Ar ion. In a region in which Sample 1 was as thick as an atom layer, structural observation, lattice image observation, micro-area (1 nm ϕ) energy-dispersive X-ray spectroscopic (EDS) analysis, and micro-area (1 nm ϕ) electron beam diffraction measurement were conducted to determine the layer structure of the hard coating. Using a field emission transmission electron microscope (JEM-2010F, available from JEOL Ltd.), the structural observation was conducted at an acceleration voltage of 200 kV. Using a UTW Si (Li) semiconductor detector attached to the apparatus available from Noran Instrument, the micro-area EDS analysis was conducted. Thus, the composition of the laminate was determined on the nanometer order. Because of using an electron probe having a half-width of 1 nm, the micro-area EDS analysis was able to determine the composition quantitatively at a thickness of 2 nm or more. The measurement accuracy was substantially within 2%.

Figure 4:
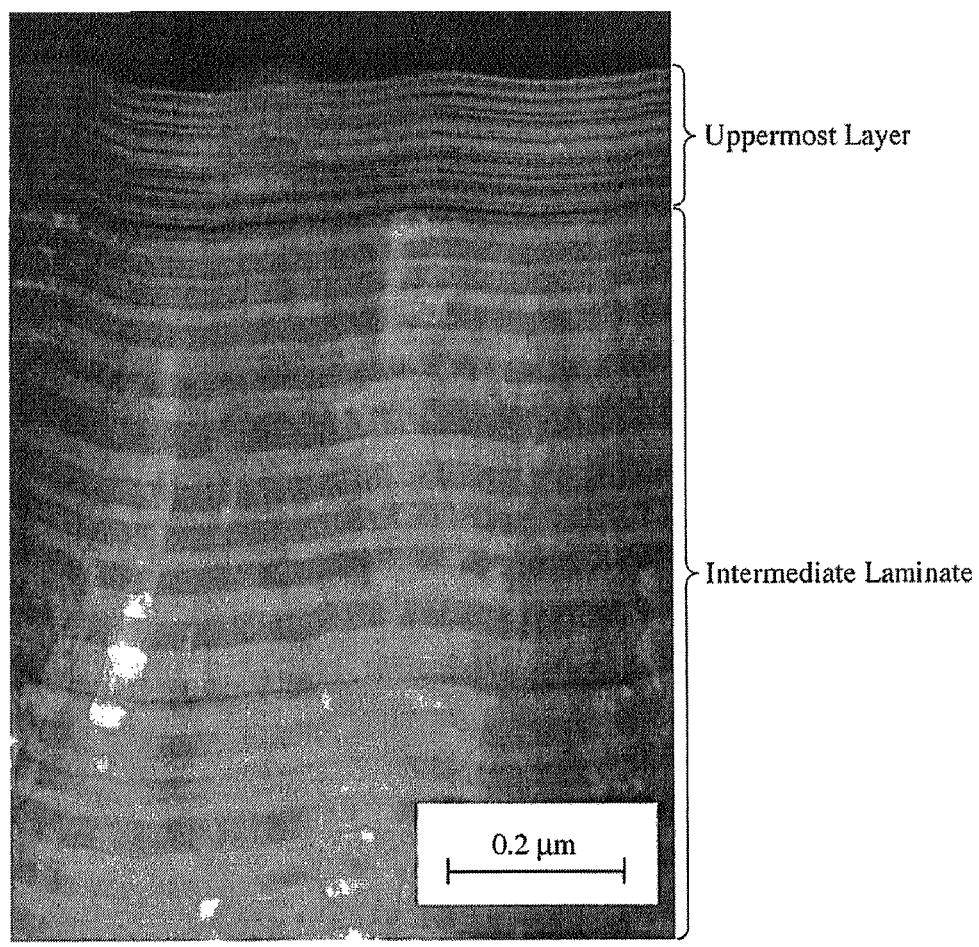
FIG. 4 is a STEM photograph showing part of the intermediate laminate and the uppermost layer of Sample 1.

The identification of the crystal structure of the laminate was conducted by the micro-area electron beam diffraction at a camera length of 50 cm and a beam diameter of 1 nm. The cross section of the intermediate laminate of Sample 1 was observed by a scanning transmission electron microscope (STEM). The results are shown in FIG. 4. The intermediate laminate of Sample 1 had a laminate structure on the nanometer order, each layer being as thick as about 0.5-100 nm.

Figure 5:
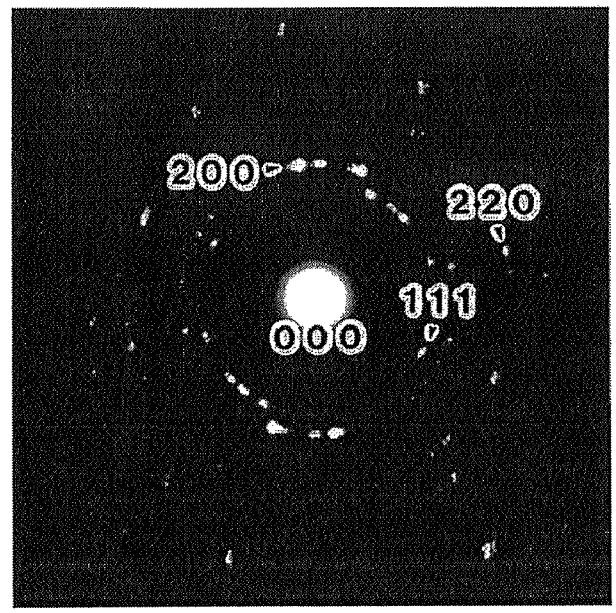
FIG. 5 is a photograph showing a selected-area diffraction image of the intermediate laminate of Sample 1.
Figure 6:
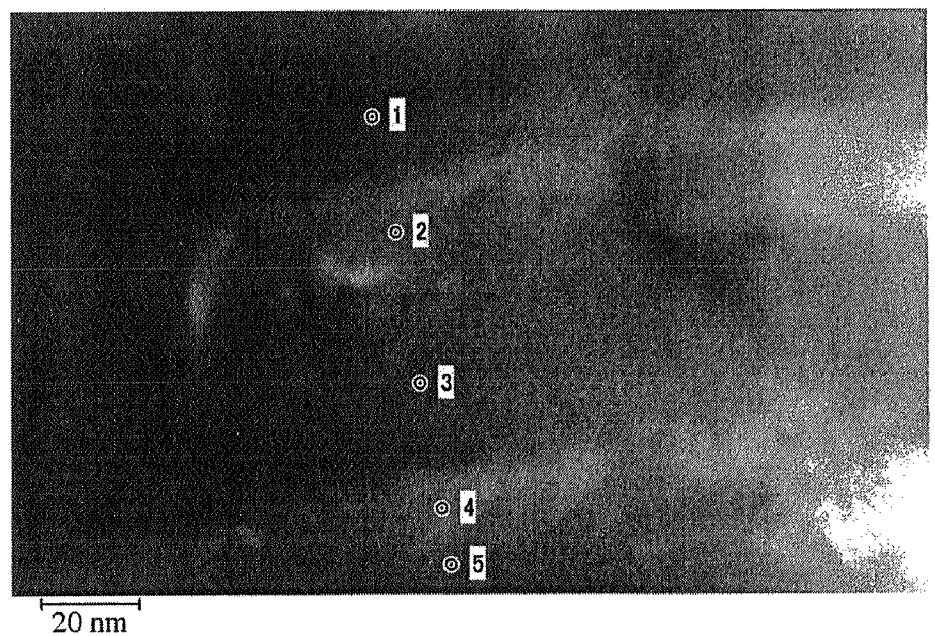
FIG. 6 is a photograph obtained by enlarging the STEM photograph of FIG. 4.

In the intermediate laminate of FIG. 4, a selected-area diffraction image of 1250 nmϕ is shown in FIG. 5. The intermediate laminate of Sample 1 had rings due to two types of lattice constants, like X-ray diffraction results. The fact that inner and outer strength distributions were the same in each ring indicates that crystal particles were aligned, and that the lattice was continuous in a thickness direction. FIG. 6 is an enlarged view of FIG. 4. The EDS composition analysis results at positions 1-5 are shown in Table 1.

TABLE 1

| Analysis Position in FIG. 6 | Composition (atomic %) | | | | Type of Layer |
|---|---|---|---|---|---|
| | Al | Si | Ti | Cr | |
| 1 | 62.65 | 3.25 | 4.46 | 29.61 | Layer A |
| 2 | 6.21 | 1.52 | 86.09 | 6.18 | Layer B |
| 3 | 61.22 | 2.00 | 2.68 | 33.30 | Layer A |
| 4 | 1.58 | 1.59 | 94.93 | 1.09 | Layer B |
| 5 | 0.93 | 2.51 | 95.43 | 1.14 | Layer B |

It is clear that the positions 1 and 3 in FIG. 6 are on the same layer, and that the positions 2, 4 and 5 are also on the same layer. Table 1 indicates that the Al content (atomic %) of Sample 1 was 61.22-62.65% in the layers A, and 0.93-6.21% in the layers B, per 100% of the metal component. Because vapor deposition is conducted while rotating the substrate, it may be presumed that a nitride of $Al_{60}Cr_{37}Si_3$ is formed when the $Al_{60}Cr_{37}Si_3$ target is close to the substrate, and that a nitride of $Ti_{100}$ is formed when the $Ti_{100}$ target is close to the substrate. However, a mixed layer of an $Al_{60}Cr_{37}Si_3$ target component and a $Ti_{100}$ target component was actually formed. This appears to be due to the fact that when coating layers as thick as several nanometers were laminated, metal components were mutually diffused between them. It is considered that this mutual diffusion enhances the layer-bonding strength, providing the hard coating with excellent wear resistance.

(5) Production of Samples 2-38

Samples 2-38 were produced in the same manner as in Sample 1 except for using various targets shown in Table 2. Samples 2-23 are Examples, Samples 24-28 are Comparative Examples, and Samples 29-38 are Conventional Examples. The hard coating of each Sample was evaluated as above. The results are shown in Table 3.

Table 2 shows the compositions of targets mounted to the evaporators 4-7. With respect to each Sample, Table 3 shows (a) the composition and thickness of the lowermost layer, (b) the compositions of layers A and B, the compositions of other layers, if any, the thickness of each layer, the presence or absence of mutual diffusion, lattice continuity, the number of peaks in a 2θ range of 40°-45°, total thickness, hardness, a modulus, and a modulus recovery ratio in the intermediate laminate, and (c) the composition and thickness of the uppermost layer. The composition of each layer in the intermediate laminate was determined by TEM-EDS in the same manner as in Sample 1. The thickness was determined from the sectional STEM image. The hardness, modulus and modulus recovery ratio of the intermediate laminate were obtained by averaging 10 values measured on the cross section (mirror-ground in a direction of 5°) of each Sample by nano-indentation under the conditions of a pushing load of 49 mN and a maximum load-holding time of 1 second.

TABLE 2

| Sample Number | Target Composition (atomic %) | | |
|---|---|---|---|
| | Targets 4, 6 | Target 5 | Target 7 |
| 1 | Al60—Cr37—Si3 | Ti | Ti |
| 2 | Al70—Cr30 | Ti | Ti |
| 3 | Al60—Cr37—Si3 | Ti | Ti |
| 4 | Al60—Cr37—Si3 | Ti75—Si25 | Ti75—Si25 |
| 5 | Al60—Cr37—Si3 | Ti | Ti75—Si25 |
| 6 | Al60—Cr37—Si3 | Ti | MoS2 |
| 7 | Al60—Cr37—Si3 | Ti | Ti |
| 8 | Al55—Cr37—Si3 | Ti95—B5 | Ti |
| 9 | Al60—Cr37—Si3 | Ti95—B5 | Ti95—B5 |
| 10 | Al50—Cr47—Si3 | Ti | Ti |
| 11 | Al60—Cr37—Si3 | Ti | Ti |
| 12 | Al60—Cr37—Si3 | Ti | Ti80—Si20 |
| 13 | Al60—Cr37—Si3 | Ti75—Si25 | Ti75—Si25 |
| 14 | Al60—Cr37—Si3 | Ti | Ti |
| 15 | Al60—Cr37—Si3 | Ti | Ti |
| 16 | Al40—Cr60 | Ti | Ti |
| 17 | Al40—Cr60 | Ti | Ti |
| 18 | Al40—Cr60 | Ti | Ti |
| 19 | Al60—Cr37—Si3 | Ti | Ti |
| 20 | Al60—Cr37—Si3 | Ti | Ti |
| 21 | Al60—Cr37—Si3 | Ti45—Al55 | Ti75—Si25 |
| 22 | Al60—Cr37—Si3 | Ti50—Al50 | Ti75—Si25 |
| 23 | Al60—Cr37—Si3 | Ti75—Al25 | Ti75—Si25 |
| 24[1] | Al40—Cr30—Si30 | Ti | Ti |
| 25[1] | Al60—Cr37—Si3 | Ti | Ti |
| 26[1] | Al20—Cr77—Si3 | Ti80—Al20 | Ti80—Al20 |
| 27[1] | Al60—Cr37—Si3 | Zr75—Si25 | Zr75—Si25 |
| 28[1] | Al60—Cr37—Si3 | Ti | Ti |
| 29[2] | Ti | Ti50—Al50 | Ti50—Al50 |
| 30[2] | Ti50—Al50 | — | — |
| 31[2] | Al60—Cr35—Si5 | — | — |
| 32[2] | Al60—Cr40 | — | — |
| 33[2] | Al70—Cr30 | — | — |
| 34[2] | Al70—Cr20—Ti10 | — | — |
| 35[2] | Al60—Cr25—Ti10—Si5 | — | — |
| 36[2] | Al90—Cr10 | Cr90—Al10 | Cr90—Al10 |
| 37[2] | Al50—Cr50 | Ti50—Al50 | Ti50—Al50 |
| 38[2] | Ti90—Al10 | Al90—Ti10 | Al90—Ti10 |

Note:
[1] Comparative Example
[2] Conventional Example

TABLE 3

| Sample Number | Lowermost Layer Composition (atomic %) | Thickness (nm) |
|---|---|---|
| 1 | (Al57—Cr41—Si2)N | 200 |
| 2 | (Al66—Cr34)N | 200 |
| 3 | (Al57—Cr41—Si2)N | 200 |
| 4 | (Al55—Cr43—Si2)N | 200 |
| 5 | (Al57—Cr41—Si2)N | 200 |
| 6 | (Al57—Cr41—Si2)N | 200 |
| 7 | (Al57—Cr41—Si2)N | 200 |
| 8 | (Al57—Cr41—Si2)N | 200 |
| 9 | (Al57—Cr41—Si2)N | 200 |
| 10 | (Al47—Cr51—Si2)N | 200 |
| 11 | (Al57—Cr41—Si2)N | 200 |
| 12 | (Al57—Cr41—Si2)N | 200 |
| 13 | (Al57—Cr41—Si2)N | 200 |
| 14 | (Al57—Cr41—Si2)N | 200 |
| 15 | (Al57—Cr41—Si2)N | 1500 |
| 16 | (Al36—Cr64)N | 200 |
| 17 | (Al36—Cr64)N | 200 |
| 18 | (Al36—Cr64)N | 200 |
| 19 | (Al57—Cr41—Si2)N | 200 |
| 20 | (Al57—Cr41—Si2)N | 200 |
| 21 | (Al52—Ti48)N | 1000 |
| 22 | (Ti52—Al48)N | 1000 |
| 23 | (Ti78—Al22)N | 1000 |
| 24[1] | (Al36—Cr40—Si24)N | 200 |
| 25[1] | (Al57—Cr41—Si2)N | 200 |
| 26[1] | (Al17—Cr82—Si1)N | 200 |
| 27[1] | (Al57—Cr41—Si2)N | 200 |
| 28[1] | (Al57—Cr41—Si2)N | 200 |
| 29[2] | (Ti)N | 500 |
| 30[2] | (Ti53—Al47)N | — |
| 31[2] | (Al56—Cr42—Si2)(N98—O2) | — |
| 32[2] | (Al56—Cr44)(N98—O2) | — |
| 33[2] | (Al66—Cr34)N | — |
| 34[2] | (Al66—Cr23—Ti10)N | — |
| 35[2] | (Al58—Cr25—Ti15—Si2)N | — |
| 36[2] | — | — |
| 37[2] | — | — |
| 38[2] | — | — |

| Sample Number | Intermediate Laminate Layer A (atomic %) | Layer B (atomic %) | Thickness of Each Layer (nm) |
|---|---|---|---|
| 1 | (Al63—Cr30—Ti4—Si3)N | (Al6—Cr6—Ti86—Si2)N | 10-40 |
| 2 | (Al6—Cr33—Ti4)N | (Al6—Cr4—Ti90)N | 10-40 |
| 3 | (Al63—Cr30—Ti4—Si3)N | (Al6—Cr6—Ti86—Si2)N | 0.5-10 |
| 4 | (Al53—Cr37—Ti6—Si4)N | (Al6—Cr5—Ti72—Si17)N | 10-40 |
| 5 | (Al63—Cr30—Ti4—Si3)N | (Al6—Cr6—Ti86—Si2)N | 10-40 |
| 6 | (Al63—Cr30—Ti4—Si3)N | (Al6—Cr6—Ti86—Si2)N | 10-40 |
| 7 | (Al63—Cr30—Ti4—Si3)NO | (Al6—Cr6—Ti86—Si2)NO | 10-40 |
| 8 | (Al63—Cr30—Ti4—Si3)NB | (Al6—Cr6—Ti86—Si2)NB | 10-40 |
| 9 | (Al63—Cr30—Ti4—Si3)NB | (Al6—Cr6—Ti86—Si2)NB | 10-40 |
| 10 | (A53—Cr40—Ti4—Si3)N | (Al6—Cr8—Ti86—Si2)N | 10-40 |
| 11 | (Al63—Cr30—Ti4—Si3)N | (Al6—Cr6—Ti86—Si2)N | 10-40 |
| 12 | (Al63—Cr30—Ti4—Si3)N | (Al6—Cr6—Ti86—Si2)N | 10-40 |
| 13 | (Al53—Cr37—Ti6—Si4)N[3] | (Al6—Cr5—Ti72—Si17)N[3] | 10-40 |
| 14 | (Al63—Cr30—Ti4—Si3)N | (Al6—Cr6—Ti86—Si2)N | 10-40 |
| 15 | (Al63—Cr30—Ti4—Si3)N | (Al6—Cr6—Ti86—Si2)N | 10-40 |
| 16 | (Al43—Cr50—Ti7)N | (Al3—Cr9—Ti91)N | 10-40 |
| 17 | (Al38—Cr55—Ti7)N | (Al2—Cr3—Ti95)N | 10-40 |
| 18 | (Al38—Cr55—Ti7)N | (Al3—Cr2—Ti95)N | 10-40 |
| 19 | (Al63—Cr30—Ti4—Si3)N | (Al6—Cr6—Ti86—Si2)N | 10-40 |
| 20 | (Al63—Cr30—Ti4—Si3)N | (Al6—Cr6—Ti86—Si2)N | 10-40 |
| 21 | (Al59—Cr28—Ti12—Si1)N | (Al54—Cr13—Ti32—Si1)N | 10-40 |
| 22 | (Al57—Cr28—Ti14—Si1)N | (Al52—Cr8—Ti38—Si1)N | 10-40 |
| 23 | (Al51—Cr27—Ti21—Si1)N | (Al31—Cr6—Ti62—Si1)N | 10-40 |
| 24[1] | (Al35—Cr35—Ti10—Si20)N | (Al6—Cr5—Ti82—Si7)N | 10-40 |
| 25[1] | (Al57—Cr41—Si2)N | TiN | 105-150 |
| 26[1] | (Al15—Cr80—Ti4—Si1)N | (Al6—Cr22—Ti70—Si2)N | 10-40 |
| 27[1] | (Al57—Cr35—Zr5—Si3)N | (A38—Cr12—Zr48—Si2)N | 10-40 |
| 28[1] | (Al63—Cr30—Ti4—Si3)N | (Al6—Cr6—Ti86—Si2)N | 10-40 |
| 29[2] | (Ti53—Al47)N | — | — |
| 30[2] | — | — | — |

TABLE 3-continued

| Sample Number | | | | |
|---|---|---|---|---|
| 31[2] | — | — | — | |
| 32[2] | — | — | — | |
| 33[2] | — | — | — | |
| 34[2] | — | — | — | |
| 35[2] | — | — | — | |
| 36[2] | (Cr95—Al5)N | (A85—Cr15)N | 10-40 | |
| 37[2] | (Ti53—Al47)N | (Cr55—Al45)N | 10-40 | |
| 38[2] | (Ti95—Al5)N | (Al85—Ti15)N | 10-40 | |

| | Intermediate Laminate | | | | |
|---|---|---|---|---|---|
| Sample Number | Mutual Diffusion | Lattice Continuity | Number of Peaks in 40°-45° | Total Thickness (nm) | Hardness (GPa) |
| 1 | Yes | Yes | 2 | 2600 | 36 |
| 2 | Yes | Yes | 2 | 2600 | 33 |
| 3 | Yes | Yes | 2 | 2600 | 39 |
| 4 | Yes | Yes | 2 | 2600 | 36 |
| 5 | Yes | Yes | 2 | 2600 | 36 |
| 6 | Yes | Yes | 2 | 2600 | 36 |
| 7 | Yes | Yes | 2 | 2600 | 38 |
| 8 | Yes | Yes | 2 | 2600 | 39 |
| 9 | Yes | Yes | 2 | 2600 | 39 |
| 10 | Yes | Yes | 2 | 2600 | 32 |
| 11 | Yes | Yes | 2 | 2600 | 36 |
| 12 | Yes | Yes | 2 | 2600 | 36 |
| 13 | Yes | Yes | 2 | 2600 | 36 |
| 14 | Yes | Yes | 2 | 1300 | 36 |
| 15 | Yes | Yes | 2 | 1000 | 36 |
| 16 | Yes | Yes | 2 | 2600 | 28 |
| 17 | Yes | Yes | 2 | 2600 | 30 |
| 18 | Yes | Yes | 2 | 2600 | 30 |
| 19 | Yes | Yes | 2 | 2600 | 36 |
| 20 | Yes | Yes | 2 | 2600 | 36 |
| 21 | Yes | Yes | 2 | 1000 | 36 |
| 22 | Yes | Yes | 2 | 1000 | 36 |
| 23 | Yes | Yes | 2 | 1000 | 32 |
| 24[1] | Yes | Yes | 2 | 2600 | 26 |
| 25[1] | No | No | 2 | 2600 | 26 |
| 26[1] | Yes | Yes | 1 | 2600 | 26 |
| 27[1] | Yes | Yes | 2 | 2600 | 29 |
| 28[1] | Yes | Yes | 2 | 2600 | 36 |
| 29[2] | — | — | — | 2500 | — |
| 30[2] | — | — | — | 3000 | — |
| 31[2] | — | — | — | 3000 | — |
| 32[2] | — | — | — | 3000 | — |
| 33[2] | — | — | — | 3000 | — |
| 34[2] | — | — | — | 3000 | — |
| 35[2] | — | — | — | 3000 | — |
| 36[2] | No | — | — | 3000 | — |
| 37[2] | No | — | — | 3000 | — |
| 38[2] | No | — | — | 3000 | — |

| | Intermediate Laminate | | Uppermost Layer | |
|---|---|---|---|---|
| | | Modulus | | |
| Sample Number | Modulus (GPa) | Recovery Ratio (%) | Composition (atomic %) | Thickness (nm) |
| 1 | 490 | 32 | Ti(CN) | 200 |
| 2 | 500 | 30 | Ti(CN) | 200 |
| 3 | 470 | 34 | Ti(CN) | 200 |
| 4 | 490 | 32 | (Ti78—Si22)N | 200 |
| 5 | 490 | 32 | (Ti78—Si22)N | 200 |
| 6 | 490 | 32 | Ti(CN)/MoS$_2$ | 200[4] |
| 7 | 470 | 34 | Ti(CN) | 200 |
| 8 | 490 | 34 | Ti(CN) | 200 |
| 9 | 500 | 32 | Ti(CNB) | 200 |
| 10 | 500 | 31 | Ti(CN) | 200 |
| 11 | 490 | 32 | TiN | 200 |
| 12 | 490 | 32 | (Ti84—Si16)N | 200 |
| 13 | 490 | 32 | (Ti78—Si22)N | 200 |
| 14 | 490 | 32 | Ti(CN) | 1500 |
| 15 | 490 | 32 | Ti(CN) | 500 |

TABLE 3-continued

| | | | | |
|---|---|---|---|---|
| 16 | 510 | 28 | Ti(CN) | 200 |
| 17 | 560 | 28 | Ti(CN) | 200 |
| 18 | 520 | 27 | Ti(CN) | 200 |
| 19 | 490 | 32 | Ti(CNO) | 200[5] |
| 20[6] | 490 | 32 | Ti(CN) | 200 |
| 21[7] | 480 | 34 | (Ti84—Si16)N | 1000 |
| 22[7] | 470 | 34 | (Ti84—Si16)N | 1000 |
| 23[7] | 510 | 32 | (Ti84—Si16)N | 1000 |
| 24[1] | 460 | 35 | Ti(CN) | 200 |
| 25[1] | 540 | 27 | Ti(CN) | 200 |
| 26[1] | 510 | 29 | Ti(CN) | 200 |
| 27[1] | 530 | 28 | (Zr78—Si22)N | 200 |
| 28[1] | 490 | 32 | — | — |
| 29[2] | — | — | — | — |
| 30[2] | — | — | — | — |
| 31[2] | — | — | — | — |
| 32[2] | — | — | — | — |
| 33[2] | — | — | — | — |
| 34[2] | — | — | — | — |
| 35[2] | — | — | — | — |
| 36[2] | — | — | — | — |
| 37[2] | — | — | — | — |
| 38[2] | — | — | — | — |

Note:
[1]Comparative Example
[2]Conventional Example
[3]The intermediate laminate had an Si content changing in a thickness direction.
[4]A 50-nm-thick Ti(CN) layer was laminated on a 150-nm-thick Ti(CN)/MoS$_2$ layer formed by sputtering and AIP.
[5]There was a high oxygen concentration on the surface.
[6]The hard coating was formed by sputtering.
[7]The substrate temperature was changed.

EXAMPLE 2

A hard coating corresponding to each Sample 1-38 of Example 1 was formed on a substrate of a 6-mm-diameter, high-speed-steel drill (cutting evaluation 1), and on a substrate of a two-edge cemented carbide ball end mill (cutting evaluation 2), respectively, and their cutting performance was evaluated under the following conditions. The layer-forming conditions of each Experiment were the same as in Example 1 unless otherwise particularly described, and the experiment numbers corresponds to the sample numbers in Example 1. The evaluation results are shown in Table 4.

(a) Conditions of Cutting Evaluation 1

Work: SCM440 (HRC 30),

Rotation speed of tool: 3200 rpm,

Feed per one rotation: 0.15 mm,

Cutting depth: 15 mm, unpenetrating hole,

Cutting method: Using an externally supplied aqueous cutting liquid, and

Determination of life: Counting the number of drilled holes until further drilling became impossible (less than 100 holes were omitted).

(b) Conditions of cutting evaluation 2

Work: Martensitic stainless steel (HRC 52),

Rotation speed of tool: 20,000 rpm,

Feed of table: 4000 m/minute,

Cutting depth: 0.4 mm in longitudinal direction and 0.2 mm in pick feed,

Cutting method: Dry cutting, and

Determination of life: Cut length until the maximum wear became as wide as 0.1 mm (less than 10 m was omitted).

TABLE 4

| Experiment Number | Cutting Evaluation 1 Number of Drilled Holes | Cutting Evaluation 2 Cutting Length (m) | Layer-Forming Conditions |
|---|---|---|---|
| 1 | 1200 | 520 | Same as Sample 1 |
| 2 | 1000 | 420 | Same as Sample 2 |
| 3 | 1800 | 580 | Same as Sample 3 |
| 4 | 1400 | 540 | Same as Sample 4 |
| 5 | 2100 | 750 | Same as Sample 5 |
| 6 | 1900 | 460 | Same as Sample 6 |
| 7 | 1800 | 580 | Same as Sample 7 |
| 8 | 1800 | 570 | Same as Sample 8 |
| 9 | 1800 | 540 | Same as Sample 9 |
| 10 | 1200 | 420 | Same as Sample 10 |
| 11 | 1000 | 380 | Same as Sample 11 |
| 12 | 2200 | 720 | Same as Sample 12 |
| 13 | 1600 | 840 | Same as Sample 13 |
| 14 | 800 | 340 | Same as Sample 14 |
| 15 | 1000 | 420 | Same as Sample 15 |
| 16 | 800 | 320 | Same as Sample 16 |
| 17 | 800 | 340 | Same as Sample 17 |
| 18 | 800 | 340 | Same as Sample 18 |
| 19 | 1600 | 580 | Same as Sample 19 |
| 20 | 1400 | 620 | Same as Sample 20 |
| 21 | 2400 | 640 | Same as Sample 21 |
| 22 | 2300 | 560 | Same as Sample 22 |
| 23 | 1900 | 550 | Same as Sample 23 |
| 24[1] | 500 | 100 | Same as Sample 24 |
| 25[1] | 400 | 80 | Same as Sample 25 |
| 26[1] | 300 | 80 | Same as Sample 26 |
| 27[1] | <100 | 50 | Same as Sample 27 |
| 28[1] | <100 | 50 | Same as Sample 28 |
| 29[2] | 300 | 50 | Same as Sample 29 |
| 30[2] | 200 | 30 | Same as Sample 30 |
| 31[2] | <100 | 80 | Same as Sample 31 |
| 32[2] | <100 | 50 | Same as Sample 32 |
| 33[2] | <100 | 70 | Same as Sample 33 |
| 34[2] | 300 | 70 | Same as Sample 34 |
| 35[2] | 300 | 90 | Same as Sample 35 |

TABLE 4-continued

| Experiment Number | Cutting Evaluation 1 Number of Drilled Holes | Cutting Evaluation 2 Cutting Length (m) | Layer-Forming Conditions |
|---|---|---|---|
| 36[2] | <100 | 30 | Same as Sample 36 |
| 37[2] | 100 | 30 | Same as Sample 37 |
| 38[2] | 200 | 50 | Same as Sample 38 |

Note:
[1]Comparative Example.
[2]Conventional Example.

As shown in Table 4, the comparison of the cutting tools of Experiments 1 and 2 (each having a hard coating formed under the layer-forming conditions of Samples 1 and 2) revealed that Sample 1 produced by using an AlCrSi target and a Ti target had a longer cutting life and thus better wear resistance than those of Sample 2 produced by using an AlCr target and a Ti target. Although the cutting tool of Experiment 3 had the same composition as that of Experiment 1, the former had a high-hardness intermediate laminate because each layer in the intermediate laminate was as thin as 0.5-10 nm, resulting in excellent cutting life. The cutting tool of Experiment 4 produced by using an AlCrSi target and a TiSi target had a longer cutting life than that of Experiment 1. The cutting tool of Experiment 5 having an intermediate laminate formed by an AlCrSi target and a Ti target, and an uppermost layer formed by a TiSi target, had excellent wear resistance.

The cutting tool of Experiment 6 had a 50-nm-thick uppermost layer of Ti(CN) formed on a laminate (thickness 150 nm) of Ti(CN) layers and $MoS_2$ layers each having a nanometer-order thickness, which were formed by simultaneously operating a sputtering evaporator and an AIP evaporator. The cutting tool of Experiment 6 was particularly suitable for drilling. The cutting tool of Experiment 7 containing oxygen in an intermediate laminate had excellent wear resistance. This appears to be due to the fact that oxygen effectively functioned to improve the hardness of the intermediate laminate and the adhesion of the layers. The cutting tool of Experiment 8 containing boron in an intermediate laminate had an excellent cutting life particularly because the intermediate laminate was hardened. The cutting tool of Experiment 9 containing boron in an intermediate laminate and an uppermost layer had excellent chip dischargeability and cutting life. The cutting tool of Experiment 10 produced by using an AlCrSi target, whose Al content was different from that of the cutting tool of Experiment 1, had excellent wear resistance like Experiment 1.

The cutting tool of Experiment 11 having an uppermost layer made of titanium nitride had a shorter cutting life than that of Experiment 1. The cutting tool of Experiment 12 having an uppermost layer of (TiSi)N had particularly excellent wear resistance. The cutting tool of Experiment 13 with an Si content gradient higher toward the upper surface in an intermediate laminate had a longer cutting life and thus better wear resistance than those of the cutting tool of Experiment 4, which had the same average composition without gradient. The cutting tools of Experiments 14 and 15 had the same thickness ratio of the lowermost layer, the intermediate laminate and the uppermost layer as that of Experiment 1.

The intermediate laminate of the cutting tool of Experiment 16 had hardness of 28 GPa, the intermediate laminate of the cutting tool of Experiment 17 had a modulus of 560 GPa, and the intermediate laminate of the cutting tool of Experiment 18 had a modulus recovery ratio of 27%. These hardness, moduli and modulus recovery ratios were outside the preferred ranges of the present invention, resulting in shorter cutting lives than those of the other cutting tools. The cutting tool of Experiment 19 having the highest oxygen concentration in a range of 100 nm or less from the hard coating surface had excellent lubrication. The cutting tool of Experiment 20 having a hard coating formed by sputtering exhibited an excellent cutting life like the cutting tools having hard coatings formed by AIP.

Samples 21-23 were produced by controlling the Ti content in the layers B of the intermediate laminate and the substrate temperature. Specifically, using an AIP method, Samples 21-23 were produced by forming a 1-μm-thick lowermost layer of (TiAl)N by the evaporator 5 under the conditions of a bias voltage of 50 V, a reaction gas pressure of 5 Pa, a substrate temperature of 500° C., and a substrate-rotating speed of 2 rpm, then forming an intermediate laminate by the evaporators 4, 5, 6 under the conditions of a bias voltage of 75 V, a reaction gas pressure of 5 Pa, a substrate temperature of 450° C., and a substrate-rotating speed of 2 rpm, and further forming a 1-μm-thick uppermost layer of (TiSi)N by the evaporator 7 under the conditions of a bias voltage of 50 V, a reaction gas pressure of 3 Pa, a substrate temperature of 450° C., and a substrate-rotating speed of 2 rpm. The cutting tools of Experiments 21-23 corresponding to these Samples exhibited excellent wear resistance with little peeling of hard coatings not only in dry cutting but also in wet or mist cutting.

The coating conditions of Comparative Examples (cutting tools of Experiments 24-28) were the same as in Experiment 1, except for partially changing the layer-forming conditions so as to provide the properties, structures, etc. shown in Table 2, using the targets 4-7 having the compositions shown in Table 2. The cutting tool of Experiment 24 had insufficient adhesion strength between the intermediate laminate and the uppermost layer and thus insufficiently improved wear resistance, because the total amount of Al and Cr in the layers A of the intermediate laminate was 70%. The cutting tool of Experiment 25 did not have improved wear resistance, because each layer in the intermediate laminate was as thick as 105-150 nm, because the uppermost layer and the intermediate laminate were not sufficiently hardened, and because there was no mutual diffusion between layers in the intermediate laminate. The cutting tool of Experiment 26 did not have improved wear resistance, because the Al content of the intermediate laminate was 15% or less, and because there was only one peak in X-ray diffraction in a 2θ range of 40° to 45°. The cutting tool of Experiment 27 having an uppermost layer containing no Ti, and the cutting tool of Experiment 28 having no uppermost layer exhibited largely varying and insufficient wear resistance.

Sample 29 had a (TiAl)N layer on a lowermost TiN layer. Sample 30 had a single (TiAl)N layer. Sample 31 had a single (AlCrSi)N layer. Samples 32 and 33 had a single (AlCr)N layer. Sample 34 had a single (AlCrTi)N layer. Sample 35 had a single (AlCrTiSi)N layer. Sample 36 had a (AlCr)N laminate. Sample 37 had a laminate of (AlCr)N and (TiAl)N. Sample 38 had a (TiAl)N laminate. The cutting tools (Experiments 29-38) produced under the same coating conditions as in Samples 29-38 suffered abnormal wear during the cutting process, resulting in insufficient wear resistance.

EXAMPLE 3

(1) Production of Sample 41

Figure 7:
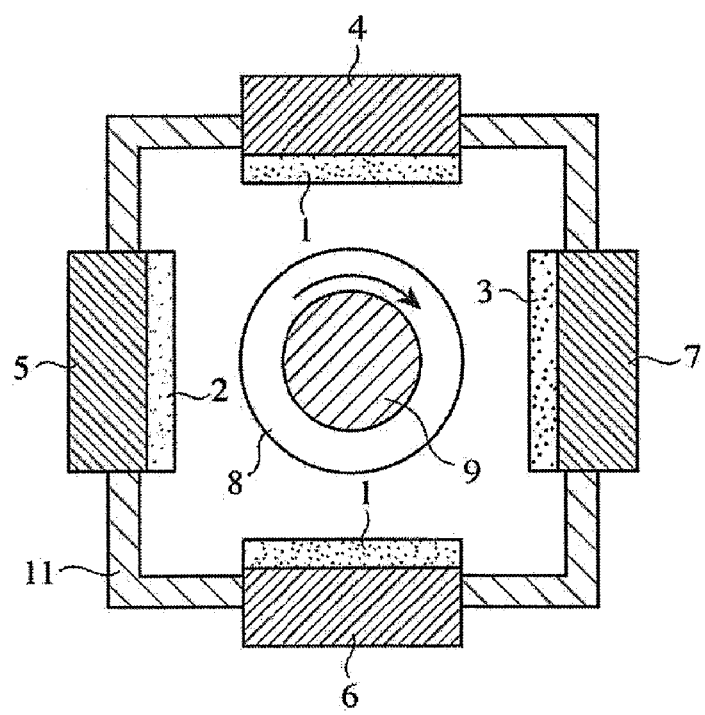
FIG. 7 is a schematic view showing another example of an apparatus for forming the hard coating.

Targets used for forming the layers of Sample 41 were metal targets produced by a powder metallurgy method. As shown in FIG. 7, a target 1 of $Al_{60}Cr_{37}Si_3$ (atomic %) was attached to each arc-discharge evaporator 4, 6, a target 2 of Ti$_{100}$ was attached to the arc-discharge evaporator 5, and a target 3 of Cr$_{90}$Si$_5$B$_5$ (atomic %) was attached to the arc evaporator 7.

(a) Formation of Lowermost Layer

Supplying current (25 V, 100 A) to the evaporator provided with the target 1, a lowermost nitride layer of about 200 nm was formed on a substrate surface under the conditions of a negative-bias voltage of 100 V, a reaction gas pressure of 4 Pa, a substrate temperature of 500° C., and a substrate-rotating speed of 3 rpm. Though the composition of the target 1 was Al$_{60}$Cr$_{37}$Si$_3$, the metal component composition of the vapor-deposited lowermost layer was Al$_{57}$Cr$_{41}$Si$_2$.

(b) Formation of Intermediate Laminate

A nitride layer was formed on the lowermost layer, by supplying current of 25 V, 100 A to the evaporator provided with the target 1, and supplying current of 20 V, 60 A to the evaporator provided with the target 2. Further, the current supplied to the evaporator provided with the target 2 was changed stepwise from 60 A to 100 A, while the current supplied to the evaporator provided with the target 1 was changed stepwise from 100 A to 60 A as the coating time passed. A pulse bias voltage (negative-bias voltage: 100 V, positive bias voltage: 10 V, frequency: 20 kHz, and amplitude; 80% on the negative side and 20% on the positive side) was applied to the substrate. An intermediate nitride laminate having a thickness of about 2600 nm was formed by the targets 1 and 2 under the conditions of a total pressure of 6 Pa, a substrate temperature of 525° C., and a substrate-rotating speed of 5 rpm.

(c) Formation of Uppermost Layer

The supply of current to the evaporators each provided with the target 1, 2 was stopped, and the supply of current to the evaporator provided with the target 3 was started to form an uppermost nitride layer of about 200 nm under the conditions of a negative-bias voltage of 80 V, a positive bias voltage of 0 V, a frequency of 10 kHz, an amplitude of 95% on the negative side and 5% on the positive side, a total pressure of 2.5 Pa, a substrate temperature of 500° C., and a substrate-rotating speed of 3 rpm.

(2) Production of Samples 42-71

Samples 42-71 were produced by forming hard coatings in the same manner as in Sample 41 except for using various targets shown in Table 5. Samples 42-65 are Examples, and Samples 66-71 are Comparative Examples. The evaluation results of the hard coating of each Sample are shown in Table 6.

TABLE 5

| Sample Number | Target Composition (atomic %) | | |
|---|---|---|---|
| | Targets 4, 6 | Target 5 | Target 7 |
| 41 | Al60—Cr37—Si3 | Ti | Cr90—Si5—B5 |
| 42 | Al70—Cr30 | Ti | Cr90—Si5—B5 |
| 43 | Al60—Cr37—Si3 | Ti | Cr90—Si5—B5 |
| 44 | Al60—Cr37—Si3 | Ti75—Si25 | Cr90—Si5—B5 |
| 45 | Al60—Cr37—Si3 | Ti | Cr |
| 46 | Al60—Cr37—Si3 | Ti | Cr/MoS2 |
| 47 | Al60—Cr37—Si3 | Ti | Cr90—Si5—B5 |
| 48 | Al55—Cr37—Si3 | Ti95—B5 | Cr90—Si5—B5 |
| 49 | Al60—Cr37—Si3 | Ti95—B5 | Cr |
| 50 | Al50—Cr47—Si3 | Ti | Cr90—Si5—B5 |
| 51 | Al60—Cr37—Si3 | Ti | Cr90—Si5—B5 |
| 52 | Al60—Cr37—Si3 | Ti | Cr80—Si20 |
| 53 | Al60—Cr37—Si3 | Ti75—Si25 | Cr75—Si25 |
| 54 | Al60—Cr37—Si3 | Ti | Cr90—Si5—B5 |
| 55 | Al60—Cr37—Si3 | Ti | Cr90—Si5—B5 |
| 56 | Al40—Cr60 | Ti | Cr90—Si5—B5 |
| 57 | Al40—Cr60 | Ti | Cr90—Si5—B5 |
| 58 | Al40—Cr60 | Ti | Cr90—Si5—B5 |
| 59 | Al60—Cr37—Si3 | Ti | Cr90—Si5—B5 |
| 60 | Al60—Cr37—Si3 | Ti | Cr90—Si5—B5 |
| 61 | Al60—Cr37—Si3 | Ti | Cr90—Si5—B5 |
| 62 | Al60—Cr37—Si3 | Ti | Cr90—Si5—B5 |
| 63 | Al60—Cr37—Si3 | Ti45—Al55 | Cr90—Si5—B5 |
| 64 | Al60—Cr37—Si3 | Ti50—Al50 | Cr90—Si5—B5 |
| 65 | Al60—Cr37—Si3 | Ti75—Al25 | Cr90—Si5—B5 |
| 66[1] | Al40—Cr30—Si30 | Ti | Cr90—Si5—B5 |
| 67[1] | Al60—Cr37—Si3 | Ti | Cr90—Si5—B5 |
| 68[1] | Al20—Cr77—Si3 | Ti80—Al20 | Cr90—Si5—B5 |
| 69[1] | Al60—Cr37—Si3 | Zr75—Si25 | Zr75—Si25 |
| 70[1] | Al60—Cr37—Si3 | Ti | — |
| 71[1] | Al60—Cr37—Si3 | Cr | Cr |

Note:
[1]Comparative Example

TABLE 6

| Sample Number | Lowermost Layer | |
|---|---|---|
| | Composition (atomic %) | Thickness (nm) |
| 41 | (Al57—Cr41—Si2)N | 200 |
| 42 | (Al66—Cr34)N | 200 |
| 43 | (Al57—Cr41—Si2)N | 200 |
| 44 | (Al55—Cr43—Si2)N | 200 |
| 45 | (Al57—Cr41—Si2)N | 200 |
| 46 | (Al57—Cr41—Si2)N | 200 |
| 47 | (Al57—Cr41—Si2)N | 200 |
| 48 | (Al57—Cr41—Si2)N | 200 |
| 49 | (Al57—Cr41—Si2)N | 200 |
| 50 | (Al47—Cr51—Si2)N | 200 |
| 51 | (Al57—Cr41—Si2)N | 200 |
| 52 | (Al57—Cr41—Si2)N | 200 |
| 53 | (Al57—Cr41—Si2)N | 200 |
| 54 | (Al57—Cr41—Si2)N | 200 |
| 55 | (Al57—Cr41—Si2)N | 1500 |
| 56 | (Al36—Cr64)N | 200 |
| 57 | (Al36—Cr64)N | 200 |
| 58 | (Al36—Cr64)N | 200 |
| 59 | (Al57—Cr41—Si2)N | 200 |
| 60 | (Al57—Cr41—Si2)N | 200 |

TABLE 6-continued

|   |   |   |
|---|---|---|
| 61 | (Al57—Cr41—Si2)N | 200 |
| 62 | (Al57—Cr41—Si2)N | 200 |
| 63 | (Al52—Ti48)N | 200 |
| 64 | (Ti52—Ti48)N | 200 |
| 65 | (Al55—Cr43—Si2)N | 200 |
| 66[1] | (Al36—Cr40—Si24)N | 200 |
| 67[1] | (Al57—Cr41—Si2)N | 200 |
| 68[1] | (Al17—Cr82—Si1)N | 200 |
| 69[1] | (Al57—Cr41—Si2)N | 200 |
| 70[1] | (Al57—Cr41—Si2)N | 200 |
| 71[1] | (Al57—Cr41—Si2)N | 200 |

Intermediate Laminate

| Sample Number | Layer A (atomic %) | Layer B (atomic %) | Thickness of Each Layer (nm) |
|---|---|---|---|
| 41 | (Al63—Cr30—Ti4—Si3)N | (Al6—Cr6—Ti86—Si2)N | 10-40 |
| 42 | (Al63—Cr33—Ti3)N | (Al6—Cr4—Ti90)N | 10-40 |
| 43 | (Al63—Cr30—Ti4—Si3)N | (Al6—Cr6—Ti86—Si2)N | 0.5-10 |
| 44 | (Al53—Cr37—Ti6—Si4)N | (Al6—Cr5—Ti72—Si17)N | 10-40 |
| 45 | (Al63—Cr30—Ti4—Si3)N | (Al6—Cr6—Ti86—Si2)N | 10-40 |
| 46 | (Al63—Cr30—Ti4—Si3)N | (Al6—Cr6—Ti86—Si2)N | 10-40 |
| 47 | (Al63—Cr30—Ti4—Si3)NO | (Al6—Cr6—Ti86—Si2)NO | 10-40 |
| 48 | (Al63—Cr30—Ti4—Si3)NB | (Al6—Cr6—Ti86—Si2)NB | 10-40 |
| 49 | (Al63—Cr30—Ti4—Si3)NB | (Al6—Cr6—Ti86—Si2)NB | 10-40 |
| 50 | (A53—Cr40—Ti4—Si3)N | (Al4—Cr8—Ti86—Si2)N | 10-40 |
| 51 | (Al63—Cr30—Ti4—Si3)N | (Al6—Cr6—Ti86—Si2)N | 10-40 |
| 52 | (Al63—Cr30—Ti4—Si3)N | (Al6—Cr6—Ti86—Si2)N | 10-40 |
| 53 | (Al53—Cr37—Ti6—Si4)N[3] | (Al6—Cr5—Ti72—Si17)N[3] | 10-40 |
| 54 | (Al63—Cr30—Ti4—Si3)N | (Al6—Cr6—Ti86—Si2)N | 10-40 |
| 55 | (Al63—Cr30—Ti4—Si3)N | (Al6—Cr6—Ti86—Si2)N | 10-40 |
| 56 | (Al43—Cr50—Ti7)N | (Al3—Cr9—Ti91)N | 10-40 |
| 57 | (Al38—Cr55—Ti7)N | (Al2—Cr3—Ti95)N | 10-40 |
| 58 | (Al38—Cr55—Ti7)N | (Al3—Cr2—Ti95)N | 10-40 |
| 59 | (Al63—Cr30—Ti4—Si3)N | (Al6—Cr6—Ti86—Si2)N | 10-40 |
| 60 | (Al63—Cr30—Ti4—Si3)N | (Al6—Cr6—Ti86—Si2)N | 10-40 |
| 61 | (Al63—Cr30—Ti4—Si3)N | (Al6—Cr6—Ti86—Si2)N | 10-40 |
| 62 | (Al63—Cr30—Ti4—Si3)N | (Al6—Cr6—Ti86—Si2)N | 10-40 |
| 63 | (Al59—Cr28—Ti12—Si1)N | (Al54—Cr13—Ti32—Si1)N | 2-20 |
| 64 | (Al57—Cr28—Ti14—Si1)N | (Al52—Cr8—Ti38—Si1)N | 2-20 |
| 65 | (Al49—Cr37—Ti10—Si4)N | (Al9—Cr9—Ti65—Si17)N | 2-20 |
| 66[1] | (Al35—Cr35—Ti10—Si20)N | (Al6—Cr5—Ti82—Si7)N | 10-40 |
| 67[1] | (Al57—Cr41—Si2)N | TiN | 105-150 |
| 68[1] | (Al15—Cr80—Ti4—Si1)N | (Al6—Cr22—Ti70—Si2)N | 10-40 |
| 69[1] | (Al57—Cr35—Zr5—Si3)N | (A38—Cr12—Zr48—Si2)N | 10-40 |
| 70[1] | (Al63—Cr30—Ti4—Si3)N | (Al6—Cr6—Ti86—Si2)N | 10-40 |
| 71[1] | (Al53—Cr45—Si2)N | (Al6—Cr92—Si2)N | 10-40 |

Intermediate Laminate

| Sample Number | Mutual Diffusion | Lattice Continuity | Number of Peaks in 40°-45° | Total Thickness (nm) | Hardness (GPa) |
|---|---|---|---|---|---|
| 41 | Yes | Yes | 2 | 2600 | 36 |
| 42 | Yes | Yes | 2 | 2600 | 33 |
| 43 | Yes | Yes | 2 | 2600 | 39 |
| 44 | Yes | Yes | 2 | 2600 | 36 |
| 45 | Yes | Yes | 2 | 2600 | 36 |
| 46 | Yes | Yes | 2 | 2600 | 36 |
| 47 | Yes | Yes | 2 | 2600 | 38 |
| 48 | Yes | Yes | 2 | 2600 | 39 |
| 49 | Yes | Yes | 2 | 2600 | 39 |
| 50 | Yes | Yes | 2 | 2600 | 32 |
| 51 | Yes | Yes | 2 | 2600 | 36 |
| 52 | Yes | Yes | 2 | 2600 | 36 |
| 53 | Yes | Yes | 2 | 2600 | 36 |
| 54 | Yes | Yes | 2 | 1300 | 36 |
| 55 | Yes | Yes | 2 | 1000 | 36 |
| 56 | Yes | Yes | 2 | 2600 | 28 |
| 57 | Yes | Yes | 2 | 2600 | 30 |
| 58 | Yes | Yes | 2 | 2600 | 30 |
| 59 | Yes | Yes | 2 | 2600 | 36 |
| 60 | Yes | Yes | 2 | 2600 | 36 |
| 61 | Yes | Yes | 2 | 2600 | 36 |
| 62 | Yes | Yes | 2 | 2600 | 36 |
| 63 | Yes | Yes | 2 | 2300 | 36 |
| 64 | Yes | Yes | 2 | 2300 | 36 |
| 65 | Yes | Yes | 2 | 2300 | 42 |

TABLE 6-continued

| | | | | | |
|---|---|---|---|---|---|
| 66[1] | Yes | Yes | 2 | 2600 | 26 |
| 67[1] | No | No | 2 | 2600 | 26 |
| 68[1] | Yes | Yes | 1 | 2600 | 26 |
| 69[1] | Yes | Yes | 2 | 2600 | 29 |
| 70[1] | Yes | Yes | 2 | 2800 | 36 |
| 71[1] | Yes | Yes | 2 | 2600 | 29 |

| | Intermediate Laminate | | Uppermost Layer | |
|---|---|---|---|---|
| Sample Number | Modulus (GPa) | Modulus Recovery Ratio (%) | Composition (atomic %) | Thickness (nm) |
| 41 | 490 | 32 | (Cr95—Si2—B3)N | 200 |
| 42 | 500 | 30 | (Cr95—Si2—B3)N | 200 |
| 43 | 470 | 34 | (Cr95—Si2—B3)N | 200 |
| 44 | 490 | 32 | (Cr95—Si2—B3)N | 200 |
| 45 | 490 | 32 | CrN | 200 |
| 46 | 490 | 32 | CrN/MoS$_2$ | 200[8] |
| 47 | 470 | 34 | (Cr95—Si2—B3)N | 200 |
| 48 | 490 | 34 | (Cr95—Si2—B3)N | 200 |
| 49 | 500 | 32 | CrN | 200 |
| 50 | 500 | 31 | (Cr95—Si2—B3)N | 200 |
| 51 | 490 | 32 | (Cr95—Si2—B3)CN | 200 |
| 52 | 490 | 32 | (Cr84—Si16)N | 200 |
| 53 | 490 | 32 | (Cr78—Si22)N | 200 |
| 54 | 490 | 32 | (Cr95—Si2—B3)N | 1500 |
| 55 | 490 | 32 | (Cr95—Si2—B3)N | 500 |
| 56 | 510 | 28 | (Cr95—Si2—B3)N | 200 |
| 57 | 560 | 28 | (Cr95—Si2—B3)N | 200 |
| 58 | 520 | 27 | (Cr95—Si2—B3)N | 200 |
| 59 | 490 | 32 | (Cr95—Si2—B3)NO | 200[5] |
| 60 | 490 | 32 | (Cr95—Si2—B3)N | 200[6] |
| 61[9] | 490 | 32 | (Cr95—Si2—B3)N | 200 |
| 62[10] | 490 | 32 | (Cr95—Si2—B3)N | 200 |
| 63[7] | 480 | 34 | (Cr95—Si2—B3)N | 500 |
| 64[7] | 470 | 34 | (Cr95—Si2—B3)N | 500 |
| 65[7] | 480 | 35 | (Cr95—Si2—B3)N | 500 |
| 66[1] | 460 | 35 | (Cr95—Si2—B3)N | 200 |
| 67[1] | 540 | 27 | (Cr95—Si2—B3)N | 200 |
| 68[1] | 510 | 29 | (Cr95—Si2—B3)N | 200 |
| 69[1] | 530 | 28 | (Zr78—Si22)N | 200 |
| 70[1] | 490 | 32 | — | — |
| 71[1] | 460 | 27 | CrN | 200 |

Note:
[1]Comparative Example
[3]The Si content in the intermediate laminate was changing in a thickness direction.
[5]The oxygen concentration was high on the surface.
[6]The hard coating was formed by sputtering.
[7]The substrate temperature was changed.
[8]A 50-nm-thick CrN layer was laminated on the 150-nm-thick uppermost layer of CrN/MoS$_2$ formed by sputtering and AIP.
[9]A 20-nm-thick DLC layer was formed on the uppermost layer.
[10]A 20-nm-thick (ArCrSi)NO layer was formed on the uppermost layer.

Table 5 shows the compositions of targets attached to the evaporators 4-7 in the vacuum chamber. Table 6 shows (a) the composition and thickness of the lowermost layer, (b) the compositions of layers A and B, the compositions of other layers, if any, the thickness of each layer, the presence or absence of mutual diffusion, lattice continuity, the number of peaks in a 2θ range of 40°-45°, total thickness, hardness, a modulus, and a modulus recovery ratio in the intermediate laminate, and (c) the composition and thickness of the uppermost layer. These properties were measured in the same manner as in Example 1.

EXAMPLE 4

Each hard coating of Samples 41-71 of Example 3 was formed on a cutting tool in the same manner as in Example 2 to evaluate its cutting performance. The layer-forming conditions in Experiments were the same as in Example 3 unless otherwise particularly described, and experiment numbers correspond to the sample numbers of Example 3. The evaluation results are shown in Table 7.

TABLE 7

| Experiment Number | Cutting Evaluation 1 Number of Drilled Holes | Cutting Evaluation 2 Cutting Length (m) | Layer-Forming Conditions |
|---|---|---|---|
| 41 | 1100 | 620 | Same as Sample 41 |
| 42 | 900 | 380 | Same as Sample 42 |
| 43 | 1800 | 680 | Same as Sample 43 |
| 44 | 1400 | 740 | Same as Sample 44 |
| 45 | 1000 | 440 | Same as Sample 45 |
| 46 | 1800 | 460 | Same as Sample 46 |
| 47 | 1300 | 660 | Same as Sample 47 |
| 48 | 1500 | 680 | Same as Sample 48 |
| 49 | 1300 | 540 | Same as Sample 49 |

TABLE 7-continued

| Experiment Number | Cutting Evaluation 1 Number of Drilled Holes | Cutting Evaluation 2 Cutting Length (m) | Layer-Forming Conditions |
|---|---|---|---|
| 50 | 900 | 360 | Same as Sample 50 |
| 51 | 1800 | 620 | Same as Sample 51 |
| 52 | 1900 | 690 | Same as Sample 52 |
| 53 | 2100 | 840 | Same as Sample 53 |
| 54 | 800 | 340 | Same as Sample 54 |
| 55 | 1000 | 420 | Same as Sample 55 |
| 56 | 800 | 320 | Same as Sample 56 |
| 57 | 800 | 340 | Same as Sample 57 |
| 58 | 800 | 340 | Same as Sample 58 |
| 59 | 1900 | 710 | Same as Sample 59 |
| 60 | 2200 | 680 | Same as Sample 60 |
| 61 | 1900 | 680 | Same as Sample 61 |
| 62 | 1800 | 700 | Same as Sample 62 |
| 63 | 2100 | 610 | Same as Sample 63 |
| 64 | 2400 | 780 | Same as Sample 64 |
| 65 | 2800 | 890 | Same as Sample 65 |
| 66[1] | 500 | 100 | Same as Sample 66 |
| 67[1] | 400 | 80 | Same as Sample 67 |
| 68[1] | 300 | 80 | Same as Sample 68 |
| 69[1] | <100 | 50 | Same as Sample 69 |
| 70[1] | 200 | 50 | Same as Sample 70 |
| 71[1] | 300 | 50 | Same as Sample 71 |

[1]Comparative Example

As is clear from Table 7, the cutting tools of Experiments 41 and 42 had improved lubrication and seizure resistance, and thus excellent wear resistance. The cutting tool of Experiment 41 produced by using an AlCrSi target and a Ti target had a longer cutting life than that of the cutting tool of Experiment 42 produced by using an AlCr target and a Ti target. The cutting tool of Experiment 43 had high hardness in the intermediate laminate, and thus excellent cutting life despite the same composition as that of the cutting tool of Experiment 41, because each layer was as thin as 0.5-10 nm in the intermediate laminate. The cutting tool of Experiment 44 produced by using an AlCrSi target and a TiSi target exhibited a longer cutting life than that of the cutting tool of Experiment 41. The cutting tool of Experiment 45 had excellent seizure resistance and wear resistance, because the intermediate laminate was formed by an AlCrSi target and a Ti target, and because the uppermost layer was formed by a Cr target.

The cutting tool of Experiment 46, in which a 200-nm-thick laminate of CrN layers and MoS$_2$ layers having nanometer-level thickness was formed by simultaneously operating a sputtering evaporator and an AIP evaporator, was particularly suitable for drilling. The cutting tool of Experiment 47 containing oxygen in the intermediate laminate had excellent seizure resistance and wear resistance. This appears to be due to the fact that oxygen is effective to increase the hardness of the intermediate laminate and to improve adhesion between layers. The cutting tools of Experiments 48 and 49 containing boron in their intermediate laminates had excellent cutting life because the intermediate laminates were hardened. The cutting tool of Experiment 50 had excellent seizure resistance and wear resistance, although the Al content of the AlCrSi target was different from that used to produce the cutting tool of Experiment 41.

The cutting tool of Experiment 51 having an uppermost layer of chromium carbonitride had a longer cutting life than that of the cutting tool of Experiment 41 containing no carbon in its uppermost layer. The cutting tool of Experiment 52 having an uppermost (CrSi)N layer were excellent particularly in seizure resistance and wear resistance. The cutting tool of Experiment 43 having an Si content gradually increasing toward the surface in the thickness direction of an intermediate laminate had a longer cutting life and better wear resistance than those of the cutting tool of Experiment 44 having no composition gradient with the same average composition. The cutting tools of Experiments 54 and 55 had different thickness ratios of the lowermost layer, the intermediate laminate and the uppermost layer from that of the cutting tool of Experiment 41. The thicker intermediate laminate as in the cutting tool of Experiment 41 provided better results.

The cutting tool of Experiment 56 comprised an intermediate laminate having hardness of 28 GPa, the cutting tool of Experiment 57 comprised an intermediate laminate having a modulus of 560 GPa, and the cutting tool of Experiment 58 had a modulus recovery ratio of 27%. With these hardness, modulus and modulus recovery ratio outside the preferred range of the present invention, the cutting tools of Experiments 56-58 had short cutting lives. The cutting tool of Experiment 59 having the maximum oxygen concentration in a range of 100 nm or less from the coating surface was particularly excellent in lubrication and seizure resistance. The cutting tool of Experiment 60 having a hard coating formed by a sputtering method exhibited an excellent cutting life like those having hard coatings formed by an AIP method.

The cutting tool of Experiment 61 had a DLC layer of about 20 nm formed on the uppermost layer by a sputtering method. The cutting tool of Experiment 62 had an (AlCrSi)(NO) layer of about 20 nm formed on the uppermost layer by a sputtering method. While the cutting tool of Experiment 41 was grayish, the cutting tools of Experiments 61 and 62 was blue, indicating that the cutting tools' color was able to be changed to such an extent not to largely affect their wear resistance.

The cutting tools of Experiments 63-65 were produced with substrate temperatures controlled depending on the Ti content of the layers B in the intermediate laminate. Using an AIP method, the cutting tools of Experiments 63 and 64 were produced by first forming a 200-nm-thick lowermost (TiAl)N layer by the evaporator 5 under the conditions of a bias voltage of 50 V, a reaction gas pressure of 5 Pa, a substrate temperature of 500° C., and a substrate-rotating speed of 2 rpm, then a 2300-nm-thick intermediate laminate by the evaporators 4, 5, 6 under the conditions of a bias voltage of 75 V, a reaction gas pressure of 5 Pa, a substrate temperature of 450° C., and a substrate-rotating speed of 8 rpm, and further a 500-nm-thick uppermost (CrSi)BN layer by the evaporator 7 under the conditions of a bias voltage of 50 V, a reaction gas pressure of 3 Pa, a substrate temperature of 450° C., and a substrate-rotating speed of 2 rpm.

In Experiment 65, using an AIP method, a 200-nm-thick lowermost (AlCrSi)N layer was first formed by the evaporators 4, 6 under the conditions of a bias voltage of 50 V, a reaction gas pressure of 5 Pa, a substrate temperature of 450° C., and a substrate-rotating speed of 2 rpm, and a 2300-nm-thick intermediate laminate was then formed by the evaporators 4, 5, 6 under the conditions of a bias voltage of 50 V, a reaction gas pressure of 5 Pa, a substrate temperature of 450° C., and a substrate-rotating speed of 8 rpm, and a 500-nm-thick uppermost (CrSiB)N layer was further formed by the evaporator 7 under the conditions of a bias voltage of 50 V, a reaction gas pressure of 3 Pa, a substrate temperature of 450° C., and a substrate-rotating speed of 2 rpm. The cutting tools of Experiments 63-65 exhibited excellent wear resistance with little peeling not only in dry cutting but also in wet or mist cutting.

Though the coating conditions of Comparative Examples were the same as those of Samples, partial modifications were made to provide the properties, structures, etc. shown in Table 6. The cutting tool of Comparative Example 66 had insufficient adhesion strength between the intermediate laminate and the uppermost layer and thus insufficient wear resistance, because the total amount of Al and Cr in the layers A was 70%. The cutting tool of Comparative Example 67 had insufficiently hardened uppermost layer and intermediate laminate without improved wear resistance, because each layer in the intermediate laminate was as thick as 105-150 nm, and because there was no mutual diffusion between layers in the intermediate laminate.

The cutting tool of Comparative Example 68 did not have improved seizure resistance and wear resistance, because the Al content of the intermediate laminate was 15% or less, and because there was only one peak in X-ray diffraction in a 2θ range of 40° to 45°. The cutting tool of Comparative Example 69 containing no Cr in an uppermost layer, and the cutting tool of Comparative Example 70 having no uppermost layer had largely changing seizure resistance and wear resistance. The cutting tool of Comparative Example 71 having an intermediate laminate formed by using an AlCrSi target and a Cr target had low hardness in the intermediate laminate, thus failing to have improved wear resistance.

EFFECT OF THE INVENTION

Because the hard-coated member of the present invention has a hard coating having not only excellent hardness and lubrication but also excellent seizure resistance and/or wear resistance, it exhibits excellent wear resistance in high-speed cutting, deep drilling, etc. Further, because the hard-coated member of the present invention has high adhesion strength between the laminated layers, peeling is unlikely to occur between the layers. Accordingly, the hard-coated member exhibits excellent peel resistance and chipping resistance, with large resistance to abnormal wear.

What is claimed is:

1. A hard-coated member comprising a hard coating comprising a lowermost layer, an intermediate laminate and an uppermost layer on a substrate member, said intermediate laminate being constituted by alternately laminated layers A and layers B having different compositions, said layers A and said layers B being respectively made of at least one member selected from the group consisting of nitrides, borides, carbides and oxides of metal components having compositions represented by the formula of $Al_W Cr_X Ti_Y Si_Z$, wherein W, X, Y and Z respectively represent atomic % of Al, Cr, Ti and Si, W+X+Y+Z=100 and Z>0, and these combinations, said layers A meeting the condition of $70 \leq W+X<100$, said layers B meeting the condition of $30 \leq Y<100$, and said uppermost layer being made of at least one member selected from the group consisting of nitrides, carbides, sulfides and borides of Ti or Ti and Si and these combinations, and wherein each of said layers A has a thickness of 2-50 nm and each of said layers B has a thickness of 2-50 nm, respectively.

2. A hard-coated member comprising a hard coating comprising a lowermost layer, an intermediate laminate and an uppermost layer on a substrate, said intermediate laminate being constituted by alternately laminated layers A and layers B having different compositions, said layers A and said layers B being respectively made of at least one member selected from the group consisting of nitrides, borides, carbides and oxides of metal components having compositions represented by the formula of $Al_W Cr_X Ti_Y Si_Z$, wherein W, X, Y and Z respectively represent atomic % of Al, Cr, Ti and Si, W+X+Y+Z=100 and Z>0, and these combinations, said layers A meeting the condition of $70 \leq W+X<100$, said layers B meeting the condition of $30 \leq Y<100$, and said uppermost layer being made of at least one member selected from the group consisting of nitrides, carbides, sulfides and borides of Cr or Cr and Si and these combinations, and wherein each of said layers A has a thickness of 2-50 nm and each of said layers B has a thickness of 2-50 nm, respectively.

3. The hard-coated member according to claim 1, wherein said uppermost layer is based on a carbonitride, a sulfide or a boride containing 50 atomic % or more of Ti.

4. The hard-coated member according to claim 2, wherein said uppermost layer is based on a carbonitride, a sulfide or a boride containing 50 atomic % or more of Cr.

5. The hard-coated member according to claim 1, wherein said intermediate laminate has at least two peaks in X-ray diffraction in a 2θ range of 40° to 45°.

6. The hard-coated member according to claim 1, wherein at least Al, Cr and Ti are mutually diffused in said layers A and said layers B constituting said intermediate laminate.

7. The hard-coated member according to claim 1, wherein said intermediate layer is alternately constituted by laminate layers A and B having different compositions, and wherein said intermediate laminate has an Si content gradient higher upward.

8. The hard-coated member according to claim 1, wherein said lowermost layer is made of a nitride comprising at least one metal element selected from the group consisting of Al, Cr, Ti and Si.

9. The hard-coated member according to claim 1, wherein there is mutual diffusion in interfaces between said lowermost layer and said intermediate laminate, between the layer A and the layer B in said intermediate laminate, and between said uppermost layer and said intermediate laminate.

* * * * *